US009847759B2

United States Patent
Nobbe et al.

(10) Patent No.: US 9,847,759 B2
(45) Date of Patent: Dec. 19, 2017

(54) SCALABLE PERIPHERY TUNABLE MATCHING POWER AMPLIFIER

(71) Applicant: Peregrine Semiconductor Corporation, San Diego, CA (US)

(72) Inventors: Dan William Nobbe, Crystal Lake, IL (US); David Halchin, Summerfield, NC (US); Jeffrey A. Dykstra, Woodstock, IL (US); Michael P. Gaynor, Crystal Lake, IL (US); David Kovac, Arlington Heights, IL (US); Kelly Michael Mekechuk, Austin, TX (US); Gary Frederick Kaatz, Barrington, IL (US); Chris Olson, Palatine, IL (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 14/957,399

(22) Filed: Dec. 2, 2015

(65) Prior Publication Data

US 2016/0087593 A1     Mar. 24, 2016

Related U.S. Application Data

(63) Continuation of application No. 13/797,779, filed on Mar. 12, 2013, now Pat. No. 9,294,056.

(51) Int. Cl.
*H03F 1/56*     (2006.01)
*H03F 3/193*     (2006.01)
(Continued)

(52) U.S. Cl.
CPC ............. *H03F 1/56* (2013.01); *H03F 1/0205* (2013.01); *H03F 1/0261* (2013.01);
(Continued)

(58) Field of Classification Search
USPC .......... 330/295, 124 R, 53–54, 84, 286, 311
See application file for complete search history.

(56) References Cited

U.S. PATENT DOCUMENTS 5,543,756 A    8/1996   Anderson
6,137,355 A    10/2000   Sevic et al.
(Continued)

FOREIGN PATENT DOCUMENTS

WO    WO 2009/108391     9/2009

OTHER PUBLICATIONS

Carrara, et al., "A 2A-GHz 24-dBm SOI CMOS Power Amplifier with Fully Integrated Reconfigurable Output Matching Network", IEEE Transactions on Microwave Theory and Techniques, vol. 57, No. 9, Sep. 2009, pp. 2122-2130.
(Continued)

*Primary Examiner* — Hieu Nguyen
(74) *Attorney, Agent, or Firm* — Jaquez Land Greenhaus LLP; Martin J. Jaquez, Esq.; Alessandro Steinfl, Esq.

(57) ABSTRACT

A scalable periphery tunable matching power amplifier is presented. Varying power levels can be accommodated by selectively activating or deactivating unit cells of which the scalable periphery tunable matching power amplifier is comprised. Tunable matching allows individual unit cells to see a constant output impedance, reducing need for transforming a low impedance up to a system impedance and attendant power loss. The scalable periphery tunable matching power amplifier can also be tuned for different operating conditions such as different frequencies of operation or different modes.

17 Claims, 28 Drawing Sheets

(51) Int. Cl.
| | |
|---|---|
| H03F 3/21 | (2006.01) |
| H03F 1/02 | (2006.01) |
| H03F 1/22 | (2006.01) |
| H03F 3/195 | (2006.01) |
| H03F 3/24 | (2006.01) |
| H03F 3/72 | (2006.01) |
| H03F 3/217 | (2006.01) |

(52) U.S. Cl.
CPC ............ *H03F 1/0277* (2013.01); *H03F 1/223* (2013.01); *H03F 3/193* (2013.01); *H03F 3/195* (2013.01); *H03F 3/211* (2013.01); *H03F 3/2176* (2013.01); *H03F 3/245* (2013.01); *H03F 3/72* (2013.01); *H03F 2200/108* (2013.01); *H03F 2200/222* (2013.01); *H03F 2200/27* (2013.01); *H03F 2200/387* (2013.01); *H03F 2200/411* (2013.01); *H03F 2200/432* (2013.01); *H03F 2200/451* (2013.01); *H03F 2203/21109* (2013.01); *H03F 2203/7215* (2013.01); *H03F 2203/7221* (2013.01)

(56) References Cited

U.S. PATENT DOCUMENTS

| | | | |
|---|---|---|---|
| 6,137,367 | A | 10/2000 | Ezzedine et al. |
| 6,236,274 | B1 | 5/2001 | Liu |
| 6,255,906 | B1 | 7/2001 | Eidson et al. |
| 6,377,117 | B2 | 4/2002 | Oskowsky et al. |
| 7,369,822 | B2 | 5/2008 | Loraine et al. |
| 7,417,508 | B1 | 8/2008 | Quaglietta |
| 7,486,135 | B2 | 2/2009 | Mu |
| 7,737,790 | B1* | 6/2010 | Chen ............... H03F 1/223 330/253 |
| 7,831,219 | B2 | 11/2010 | Heuermann et al. |
| 8,138,829 | B2 | 3/2012 | Reddy et al. |
| 8,150,343 | B2 | 4/2012 | Ramachandra Reddy |
| 8,188,788 | B2 | 5/2012 | Lee |
| 8,244,194 | B2 | 8/2012 | Morgan et al. |
| 8,330,547 | B2 | 12/2012 | Godbole |
| 8,350,627 | B2 | 1/2013 | Helberg |
| 8,634,789 | B2 | 1/2014 | Chang et al. |
| 8,928,415 | B2* | 1/2015 | Cha ............... H03F 1/223 330/311 |
| 9,276,527 | B2 | 3/2016 | Gaynor |
| 9,294,056 | B2 | 3/2016 | Nobbe et al. |
| 9,331,643 | B2 | 5/2016 | Gaynor |
| 9,455,670 | B2 | 9/2016 | Kovac |
| 9,602,063 | B2 | 3/2017 | Kaatz et al. |
| 2004/0100341 | A1 | 5/2004 | Luetzeischwab et al. |
| 2008/0039025 | A1 | 2/2008 | Ray et al. |
| 2011/0260780 | A1 | 10/2011 | Granger-Jones et al. |
| 2012/0154054 | A1 | 6/2012 | Kaczman et al. |
| 2014/0266433 | A1 | 9/2014 | Nobbe et al. |
| 2014/0266455 | A1 | 9/2014 | Kaatz et al. |
| 2014/0266460 | A1 | 9/2014 | Nobbe et al. |
| 2015/0091656 | A1 | 4/2015 | Gaynor |
| 2015/0091657 | A1 | 4/2015 | Gaynor |
| 2017/0149391 | A1 | 5/2017 | Kaatz et al. |

OTHER PUBLICATIONS

Outten, Samuel, Notice of Allowance received from the USPTO dated Aug. 8, 2016 for U.S. Appl. No. 13/797,686, 9 pgs.

Kim, et al. "Efficiently Amplified." IEEE Microwave Magazine, Aug. 2010, pp. 87-100.

McCune, et al. "Microwave Bytes." IEEE Microwave Magazine, Jun. 2012, pp. 34-56.

Wang, et al. "MM-Wave Integration and Combinations." IEEE Microwave Magazine, Jul./Aug. 2012, pp. 49-57.

Asbeck, et al. "Si IC Development for High Efficiency Envelope Tracking Power Amplifiers." IEEE Microwave Magazine, 2012, pp. 1-4.

Li, et al. "Design of High Efficiency Monolithic Power Amplifier With Envelope-Tracking and Transistor Resizing for Broadband Wireless Applications." IEEE Journal of Solid-State Circuits, vol. 47 (9), Sep. 2012, pp. 1-12.

Wimpenny, et al. Envelope GaAs HBT PA performance characterization under high load mismatch conditions, IEEE, 2012, pp. 37-40.

Kihara, T. et I. "A Multiband LTE SAW-less CMOS Transmitter with Source-Follower-Drived Passive Mixers, Envelope-Tracked RF-PGAs, and Marchand Baluns." IEEE Radio Frequency Integrated Circuits Symposium, 2012, pp. 399-402.

Leifso, C. et al. "A Fully Integrated Active Inductor with Independent Voltage Tunable Inductance and Series-Loss Resistance." IEEE Transactions on Microwave Theory and Techniques, vol. 49 (4), Apr. 2001, pp. 671-676.

Hedayati, H. et al. A 2-GHz Highly Linear Efficient Dual-Mode BiCMOS Power Amplifier Using a Reconfigurable Matching Network, IEEE Journal of Solid State Circuits, 2012, pp. 1-20.

Kawai, K. et al. "Ring Resonators for Bandwith and Center Frequency Tunable Filter." Proceedings of the 37th European Microwave Conference, Oct. 2007, pp. 298-301.

Oh, Hyoung-Seok, et al. "A Fully-Integrated +23-dBm CMOS Triple Cascode Linear Power Amplifier with Inner-Parallel Power Control Scheme." Radio Frequency Integrated Circuits (RFIC) Symposium, 2006 IEEE, pp. 1-4.

Mohamed, et al. "Novel Reconfigurable Fundamental/Harmonic Matching Network for Enhancing the Efficiency of Power Amplifiers" 40th European Microwave Conference, Sep. 2010, pp. 1122-1125.

Tu, Steve, "A Power-Adaptive CMOS Class E RF Tuned Power Amplifier for Wireless Communications" IEEE, 2003, pp. 365-368.

Choi, et al. "A MMIC Smart Power Amplifier with On-Chip Dynamic Bias Controller for WCDMA Mobile Communication" IEEE, 2004, pp. 351-354.

Sankey, et al. "Adaptive Tuning for Handheld Transmitters" IEEE, 2009, pp. 225-228.

Kim, et al. "A Linear Multi-Mode CMOS Power Amplifier With Discrete Resizing and Concurrent Power Combining Structure" IEEE Journal of Solid-State Circuits vol. 46, No. 5, May 2011, pp. 1034-1048.

Ahmed, et al. "DTX: A Revolutionary Digital Transmitter Technology to Provide Multi-Mode/Multi-Band Capability" Proceeding of the SDR 04 Technical Conference and Product Exposition, 2004, pp. 1-5.

Kanda, et al. "A Fully Integrated Triple-Band CMOS Power Amplifier for WCDMA Mobile Handsets" IEEE International Solid-State Circuits Conference, Session 4, RF Techniques, 4.7, Feb. 20, 2012, pp. 86-88.

Kim, et al. "A Power Efficient W-CDMA Smart Power Amplifier With Emitter Area Adjusted for Output Power Levels" IEEE MTT-S Digest, 2004, pp. 1165-1168.

Gamal El Din, et al. "Adaptive Matching for Efficiency Enhancement of Switching Mode and Nonlinear Microwave Power Amplifiers" IEEE, 2010, pp. 192-195.

Vreede, et al. "Ultra-low Distortion Varactors for Adaptive RF Systems" European Microwave Week, Amsterdam, Oct. 2008, 26 pgs.

Asbeck, et al. "CMOS Handset Power Amplifiers: Directions for the Future" IEEE, 2012, 6 pgs.

Kim, et al. "A Multi-Band Reconfigurable Power Amplifier for UMTS Handset Applications" IEEE Radio Frequency Integrated Circuits Symposium, 2010, pp 175-178.

Asbeck, et al. "Design Options for High Efficiency Linear Handset Power Amplifiers" IEEE, 2009, pp. 1-4.

Moon, J. et al. "Highly Efficient Saturated Power Amplifier." IEEE Microwave Magazine, Jan. 2012, pp. 125-131.

Babcock, W.C. "Intermodulation Interference in Radio Systems—Frequency of Occurrence and Control by Channel Selection." The Bell System Technical Journal, Jan. 1953, pp. 63-73.

Calvo, Carlos, "Calibration and temperature-compensation techniques using an rms-responding RF detector", Microwave/Millimeter-Wave Technology, www.rfdesign.com, Aug. 2006, pp. 28-35.

(56) References Cited

OTHER PUBLICATIONS

Hau, et al., "A WCDMA HBT Power Amplifier Module with Integrated Si DC Power Management IC for Current Reduction under Backoff Operation", 2007 IEEE Radio Frequency Integrated Circuits Symposium, pp. 75-78.

Degani, et al., "A 90nm CMOS PA Module for 4G applications with embedded PVT gain compensation circuit", Mobility Wireless Group, Intel Israel (74) LTD., IEEE 2012, pp. 25-28.

Kim, et al., "High Efficiency and Linear Dual Chain Power Amplifier without/with Automatic Bias Current Control for CDMA Handset Applications", 12th GAAS Symposium—Amsterdam, 2004, pp. 531-534.

Sahu, et al., "A High Efficiency WCDMA RF Power Amplifier with Adaptive, Dual-Mode Buck-Boost Supply and Bias-Current Control", Manuscript received on May 9, 2006, revised on Sep. 1, 2006, IEEE, pp. 1-3.

Noh, et al., "An Intelligent Power Amplifier MMIC Using a New Adaptive Bias Control Circuit for W-CDMA Applications", IEEE Journal of Solid-State Circuits, vol. 39, No. 6, Jun. 2004, pp. 967-970.

Kousai, et al., "A 28.3mW PA-Closed Loop for Linearity and Efficiency Improvement Integrated in a +27.1dBm WCDMA CMOS Power Amplifier", ISSCC 2012, Session 4, RF Techniques, 4.6, 3 pgs.

Outten, Samuel S., Office Action received from the USPTO dated Feb. 20, 2015 for U.S. Appl. No. 13/797,686, 21 pgs.

Nguyen, Khanh V., Office Action received from the USPTO dated Mar. 12, 2015 for U.S. Appl. No. 14/042,312, 17 pgs.

Nguyen, Khanh V., Office Action received from the USPTO dated Apr. 17, 2015 for U.S. Appl. No. 14/042,331, 16 pgs.

Gaynor, Michael, Response filed in the USPTO dated May 12, 2015 for U.S. Appl. No. 14/042,312, 7 pgs.

Kaatz, et al., Response filed in the USPTO dated May 14, 2015 for U.S. Appl. No. 13/797,686, 14 pgs.

Ezzeddine, et al., "The High Voltage/High Power FET (HiVP1)", 2003 IEEE Radio Frequency Integrated Circuits Symposium, pp. 215-218.

Gaynor, Michael, Amendment filed in the USPTO dated Jul. 17, 2015 for U.S. Appl. No. 14/042,331, 9 pgs.

Outten, Samuel S., Final Office Action received from the USPTO dated Aug. 10, 2015 for U.S. Appl. No. 13/797,686, 21 pgs.

Nguyen, Khanh V., Notice of Allowance received from the USPTO dated Aug. 31, 2015 for U.S. Appl. No. 14/042,312, 20 pgs.

Nguyen, Khanh V., Notice of Allowance received from the USPTO dated Oct. 13, 2015 for U.S. Appl. No. 14/042,312, 9 pgs.

Nguyen, Khanh V., Final Office Action received from the USPTO dated Oct. 20, 2015 for U.S. Appl. No. 14/042,331, 8 pgs.

Kaatz, et al., Response After Final filed in the USPTO dated Nov. 4, 2015 for U.S. Appl. No. 13/797,686, 12 pgs.

Outten, Samuel S., Advisory Action received from the USPTO dated Nov. 13, 2015 for U.S. Appl. No. 13/797,686, 4 pgs.

Gaynor, Michael, Amendment After Final filed in the USPTO dated Dec. 15, 2015 for U.S. Appl. No. 14/042,331, 8 pgs.

Nguyen, Khanh, Advisory Action received from the USPTO dated Jan. 15, 2016 for for U.S. Appl. No. 14/042,331, 4 pgs.

Nguyen, Hieu P., Office Action received from the USPTO dated Oct. 9, 2014 for U.S. Appl. No. 13/797,779, 6 pgs.

Nguyen, Hieu P., Office Action received from the USPTO dated Jan. 26, 2015 for U.S. Appl. No. 13/797,779, 53 pgs.

Nguyen, Hieu P., Notice of Allowance received from the USPTO dated Jul. 20, 2015 for U.S. Appl. No. 13/797,779, 53 pgs.

Nguyen, Hieu P., Notice of Allowance received from the USPTO dated Nov. 2, 2015 for U.S. Appl. No. 13/797,779, 12 pgs.

Nguyen, Hieu P., Notice of Allowance received from the USPTO dated Dec. 18, 2015 for U.S. Appl. No. 13/797,779, 20 pgs.

Nobbe, et al., Comments on Examiner's Statement of Reasons for Allowance filed in the USPTO dated Jan. 27, 2016 for U.S. Appl. No. 13/797,779, 5 pgs.

Nobbe, et al., Preliminary Amendment filed in the USPTO dated Jul. 11, 2014 for U.S. Appl. No. 13/797,779, 46 pgs.

Nobbe, et al., Response to Restriction Requirement filed in the USPTO dated Dec. 9, 2014 for U.S. Appl. No. 13/797,779, 44 pgs.

Nobbe, et al., Response t filed in the USPTO dated May 14, 2015 for U.S. Appl. No. 13/797,779, 52 pgs.

Gaynor, Michael, Amendment After Final filed in the USPTO dated Feb. 2, 2016 for U.S. Appl. No. 14/042,331, 8 pgs.

Nguyen, Khanh, Notice of Allowance received from the USPTO dated Feb. 2, 2016 for U.S. Appl. No. 14/042,331, 8 pgs.

Outten, Samuel, Office Action received from the USPTO dated Mar. 21, 2016 for U.S. Appl. No. 13/797,686, 29 pgs.

Kaatz, et al., Amendment filed in the USPTO dated May 23, 2016 for U.S. Appl. No. 13/797,686, 12 pgs.

Outten, Samuel S., Notice of Allowance received from the USPTO dated Nov. 3, 2016 for U.S. Appl. No. 13/797,686, 9 pgs.

Outten, Samuel S., Office Action received from the USPTO dated Sep. 26, 2017 for U.S. Appl. No. 15/422,282, 34 pgs.

\* cited by examiner

SCALABLE PERIPHERY TUNABLE MATCHING POWER AMPLIFIER

CROSS REFERENCE TO RELATED APPLICATIONS—CLAIM OF PRIORITY

The present application is a continuation of commonly owned co-pending U.S. patent application Ser. No. 13/797,779 filed on Mar. 12, 2013. Application Ser. No. 13/797,779 is hereby incorporated by reference herein in its entirety.

Patent application Ser. No. 13/797,779 may be related to U.S. patent application Ser. No. 13/797,686 filed on Mar. 12, 2013, entitled "Variable Impedance Match and Variable Harmonic Terminations for Different Modes and Frequency Bands", which is incorporated herein by reference in its entirety.

BACKGROUND

1. Field

The present disclosure relates to power amplifiers. More particularly, the present disclosure relates to scalable periphery tunable matching power amplifiers.

2. Description of Related Art

In the field of mobile radios, a typical power amplifier vendor is dependent on the ability to quickly change either a power amplifier (PA) or a power amplifier module (PAM). Power amplifiers and power amplifier modules are typically needed to meet custom specifications from mobile radio manufacturers to meet their customer's system specifications. This can be a difficult task for those PAs and PAMs implemented in silicon (Si) technologies due in part to long design cycle times and also long fabrication cycle times. These Si technologies include, but are not limited to, complementary metal oxide semiconductor (CMOS) technology, silicon on insulator (SOI) CMOS technology, silicon on sapphire (SOS) CMOS technology, and bipolar CMOS (BiCMOS) technology (e.g. technology involving a combination of bipolar junction transistors and CMOS transistors).

A power amplifier is an important component in many radio frequency (RF) systems, as the power amplifier is usually necessary to amplify an RF signal prior to transmitting the RF signal using an antenna. During cellular voice communications, a power amplifier typically spends a small fraction of operation time operating at peak power level. However, during wireless data communications, the power amplifier can spend a significant portion of operation time operating at peak power level to allow more efficient data transmission.

Various cellular communications devices operate on different frequency bands in the RF spectrum. For example, there are frequency bands in use at 700-900 MHz and 1700-2400 MHz as well as many others. Current cellular devices are not capable of covering multiple bands simultaneously because of expense incurred when adding extra components that would enable such cellular devices to cover multiple bands simultaneously. However, an amplifier that can be tuned can be utilized to enable a power amplifier in an RF front-end that covers many bands. For this reason, tunability of power amplifiers shows promise for future power amplifier design.

SUMMARY

According to a first aspect of the present disclosure, an amplifier is provided, the amplifier comprising: a scalable periphery amplifier comprising one or more unit cells connected in parallel with each other and adapted to be selectively activated or deactivated, wherein each unit cell comprises a plurality of active devices configured to operate as an amplifier; an output tunable matching network operatively connected to an output of the scalable periphery amplifier, wherein the tunable matching network is configured to adjust an output load impedance seen by the output of the scalable periphery amplifier; and an amplifier control circuitry configured to selectively activate or deactivate the one or more unit cells, thus varying a total output power from the amplifier, wherein the plurality of active devices of the one or more unit cells are a stack of a plurality of transistors, an input transistor of the plurality of transistors in the stack being configured to receive an input signal of the scalable periphery amplifier.

According to a second aspect of the present disclosure, an amplifier is provided, the amplifier comprising: a scalable periphery amplifier comprising one or more unit cells connected in parallel with each other and adapted to be selectively activated or deactivated, wherein at least one unit cell comprises one transistor configured to operate as an amplifier; an output tunable matching network operatively connected to an output of the scalable periphery amplifier, wherein the tunable matching network is configured to adjust an output load impedance seen by the output of the scalable periphery amplifier; and an amplifier control circuitry configured to selectively activate or deactivate the one or more unit cells, thus varying a total output power from the amplifier, wherein the one transistor of the at least one unit cell is configured to receive an input signal of the scalable periphery amplifier.

According to a third aspect of the present disclosure, a method for biasing a scalable periphery amplifier is provided, the method comprising: providing a plurality of amplifiers of the scalable periphery amplifier, wherein each amplifier of the plurality of amplifiers of the scalable periphery amplifier comprises a plurality of transistors configured in a stacked arrangement; operatively coupling the plurality of amplifiers in a parallel arrangement; providing an input power range for an input signal to the plurality of amplifiers of the scalable periphery amplifier; providing a desired power gain of the scalable periphery amplifier; obtaining an expected output power range of the scalable periphery amplifier based on the desired power gain and the input power range; based on the obtaining, activating one or more amplifiers from the plurality of amplifiers.

According to a fourth aspect of the present disclosure, a method for amplifying an input signal is provided, the method comprising: providing a plurality of amplifiers, wherein each amplifier of the plurality of amplifiers comprises a plurality of transistors configured in a stacked arrangement; operatively coupling the plurality of amplifiers in a parallel arrangement; providing a plurality of switches configured to selectively activate or deactivate the plurality of amplifiers; coupling a tunable matching network to an input port of the plurality of amplifiers; inputting an input signal to the tunable matching network; measuring the input signal power level; activating one or more amplifiers from the plurality of amplifiers based on the input signal power level and on a desired output signal power level, and adjusting an impedance of the tunable matching network in correspondence of an input signal power level shift in correspondence of further activating or deactivating of the one or more amplifiers from the plurality of amplifiers, wherein the further activating or deactivating of the one or more amplifiers is in correspondence of a desired output signal characteristic.

BRIEF DESCRIPTION OF DRAWINGS

FIGS. 13-14 show a graphical representation of Pout vs. ACLR (adjacent channel leakage ratio) for class A and class AB operation respectively, when half of the total number of unit cells are on, compared with when all of the unit cells are on.

DETAILED DESCRIPTION

Figure 1:
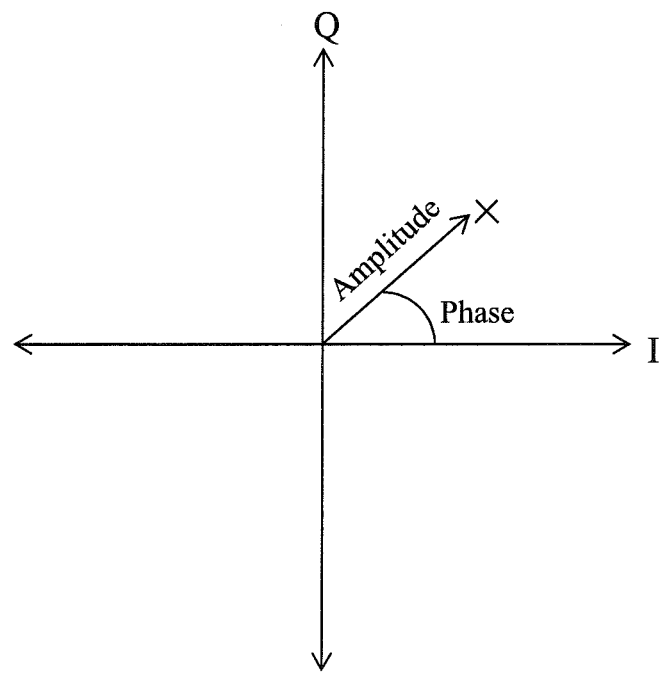
FIG. 1 shows a vector representation of a modulated RF signal in the baseband [I, Q] plane.

As used in the present disclosure, the terms "switch ON" and "activate" may be used interchangeably and can refer to making a particular circuit element electronically operational.

As used in the present disclosure, the terms "switch OFF" and "deactivate" may be used interchangeably and can refer to making a particular circuit element electronically non-operational.

As used in the present disclosure, the terms "amplifier" and "power amplifier" may be used interchangeably and can refer to a device that is configured to amplify a signal input to the device to produce an output signal of greater magnitude than the magnitude of the input signal.

As used in the present disclosure, the term "mode" can refer to a wireless standard and its attendant modulation and coding scheme or schemes. As different modes may require different modulation schemes, these may affect required channel bandwidth as well as affect the peak-to-average-ratio (PAR), also referred to as peak-to-average-power-ration (PAPR), as well as other parameters known to the skilled person. Examples of wireless standards include Global System for Mobile Communications (GSM), code division multiple access (CDMA), Worldwide Interoperability for Microwave Access (WiMAX), Long Term Evolution (LTE), as well as other wireless standards identifiable to a person skilled in the art. Examples of modulation and coding schemes include binary phase-shift keying (BPSK), quadrature phase-shift keying (QPSK), quadrature amplitude modulation (QAM), 8-QAM, 64-QAM, as well as other modulation and coding schemes identifiable to a person skilled in the art.

As used in the present disclosure, the term "efficiency" can refer to a measure of how well a device converts one energy source to another. In a case of an NMOS device configured as a power amplifier, (drain) efficiency of the NMOS device is a metric that quantifies conversion of direct current (DC) power that is input to a drain of the NMOS device to RF power output from the drain of the NMOS device. Power added efficiency (PAE) provides a metric of efficiency that takes into consideration that gain of the power amplifier is not infinite. Corresponding drain efficiency and PAE equations are provided in a later section.

As used in the present disclosure, the term "channel" can refer to a frequency range. More in particular, the term "channel" as used herein refers to a frequency range that can be defined by a wireless standard such as, but not limited to, wideband code division multiple access (WCDMA) and long term evolution (LTE). As is well known, adjacent channel leakage ratio (ACLR) provides a ratio of adjacent channel power to main channel power. For instance, in WCDMA, a channel bandwidth is 5 MHz. If power is to be transmitted on/within a main channel of 1925 MHz to 1930 MHz, adjacent channels would encompass 5 MHz below the main channel (i.e. 1920 MHz to 1925 MHz) and 5 MHz above the main channel (i.e. 1930 MHz to 1935 MHz), and the ACLR will be ratio of power leaked into one or the other adjacent channel to power in the main channel (e.g. ACLR (low) will refer to a ratio using the power leaked into the lower adjacent channel). Consequently, the ACLR can be utilized as a measure of linearity of a device.

According to several embodiments of the present disclosure, scalable periphery, tunable matching, digital control circuitry, and/or other adjustments can be utilized to reconfigure a power amplifier after fabrication (e.g. at final test, where product personality plus manufacturing offsets can be stored in the power amplifier) or during operation of a device containing the power amplifier. A need to reconfigure a power amplifier may be in response to a change in a customer's specification or to enable use of a single PA platform for different applications that span different frequencies, different power ranges, and/or different modes.

If techniques of scalable periphery (SP) and tunable matching (TM) are applied together in accordance with several embodiments of the present disclosure, a PA platform can be tuned, for example, for multiple wireless standards and/or multiple frequency bands. This means that a single PA with scalable periphery and tunable matching can be used in multiple products without a new design cycle, which also translates to reduced manufacturing and production cost. Furthermore, a given wireless device containing a single PA with scalable periphery and tunable matching can be compatible with many different frequency bands and/or different wireless standards. Technical details are provided in the following discussion.

FIG. 1 shows a vector representation of a modulated RF signal in an [I, Q] plane. A modulated RF signal may be represented in terms of an in-phase component I and a quadrature component Q. A person skilled in the art should be aware that the quadrature component of a signal is 90 degrees (one quarter of a cycle) out of phase compared to the in-phase component. As a result, the in-phase component I usually represents a component, either constant or time-varying, multiplied by $\cos(\omega_c t)$ whereas the quadrature component Q usually represents a component, either constant or time-varying, multiplied by $\sin(\omega_c t)$, where $\omega_c$ represents radian frequency of a carrier wave.

Amplitude of the RF signal is a function of length of a vector drawn from the origin to a point representing the RF signal in the [I, Q] plane, and square of the amplitude of the RF signal is proportional to power of the signal. Consequently, if a multiplicity of possible positions of the modulated RF signal's representation in the [I, Q] plane forms a circle centered on the origin, then the length of the vector drawn from the origin to any of these possible positions remains constant and similarly the power of the RF signal remains constant. A signal of this type would be referred to as a constant envelope signal, an example of which is a frequency modulated signal. For an exemplary case of a constant envelope signal, a power amplifier that is configured to amplify such a signal has no linearity requirements and can remain saturated.

Figure 2:
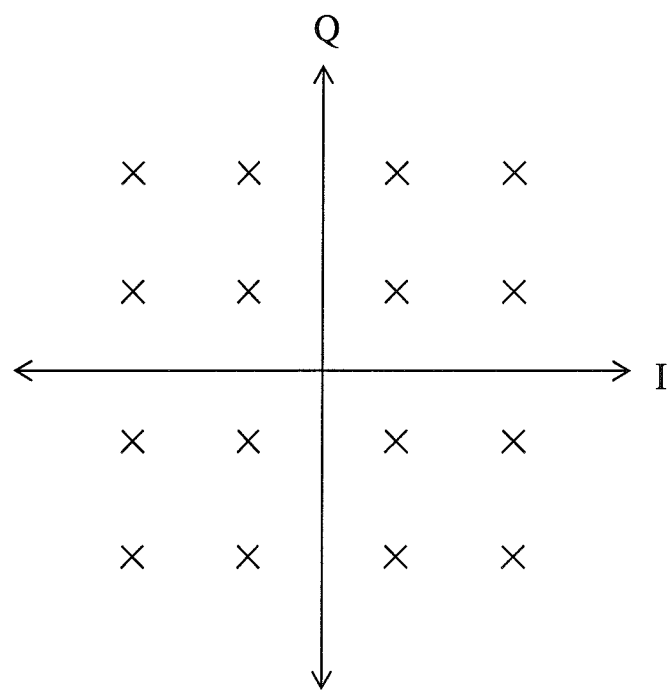
FIG. 2 shows a signal constellation for the case of 16-QAM.

However, to increase data rate given a fixed bandwidth, it may become necessary to transmit signals whose representations in the [I, Q] plane are at differing distances from the origin, implying different amplitudes and therefore different power levels, to be transmitted. FIG. 2 shows a signal constellation for the case of 16-QAM. A person skilled in the art will be aware that other variations of QAM can be used as well (e.g. 64-QAM or 1024-QAM, among others), or even other digital modulation schemes (e.g. PAM, ASK, AM-PSK, etc. . . . ). Because of differing power levels being transmitted and changing at the rate of the modulation, there is now a linearity requirement imposed on the power amplifier.

Generally, the power amplifier is designed to operate within a specific frequency range of operation (also referred to as a frequency channel or just channel). Nonlinearities in a power amplifier can result in spectral distortion, leading to signal leakage into adjacent channels corresponding to frequencies neighboring those of a main channel within which operation is desired. A power amplifier is generally designed so as to maintain a low ACLR, where a low ACLR signifies lower nonlinearity of the power amplifier. The ACLR may be measured as, for instance, a ratio of the power measured in the adjacent RF channel to the transmitted power in the main channel. More in particular, the powers can be measured after a receiver filter that is present in an RF receiver circuit, where the receiver filter comprises a bandpass filter configured to reject image signals and otherwise reduce interference between channels. However, the linearity requirement conflicts with power considerations because higher efficiency typically occurs when the power amplifier is driven into nonlinear operation. Thus, there is a trade-off between linearity and efficiency.

Another consideration in power amplifier design is a ratio of peak transmitted power to average transmitted power to a load, a measure often referred to as peak to average power ratio (PAPR). Normally, it is desirable to keep the PAPR as low as possible to maximize efficiency. In general, a PA designer does not have much choice in this matter as PAPR is defined by a system standard (e.g. WCDMA, LTE, and so on) and data being transmitted. The PA may reduce PAPR as the PA is driven to operate near compression. Compression is often defined at the 1 dB compression point. Examples of loads to which power may be transmitted include, but are not limited to, an antenna of a cell phone; downstream splitters, cables, or feed network(s) used in delivering cable television service to a consumer; a next amplifier in an RF chain at a cellular base station; or a beam forming network in a phased array radar system. Other example loads identifiable by a person skilled in the art can also be utilized.

Additionally, a power amplifier may be required to operate under many different conditions. By way of example, the different conditions may be a result of a change in operating frequency (e.g. frequency of the carrier wave), a change in modulation scheme (e.g. from 64-QAM to QPSK), or a change in average power level transmitted, a change in battery voltage, and/or a change in temperature. For instance, fourth generation (4G) devices transmit signals corresponding to 64, 16, or 4 points in the [I, Q] plane, corresponding to 64-QAM, 16-QAM, or QPSK, respectively for each subcarrier, and transmit many carriers in an OFDMA (Orthogonal Frequency Division Multiple Access) system. Although one particular mode of operation of the power amplifier can be optimized, attempting to design the power amplifier for many different modes of operation may lead to degradation in performance metrics such as linearity (e.g. as measured using ACLR) and/or efficiency. A mode of operation depends on modulation and coding scheme, frequency, bandwidth, PAR, and other characteristics such as those mentioned previously.

Figure 3:
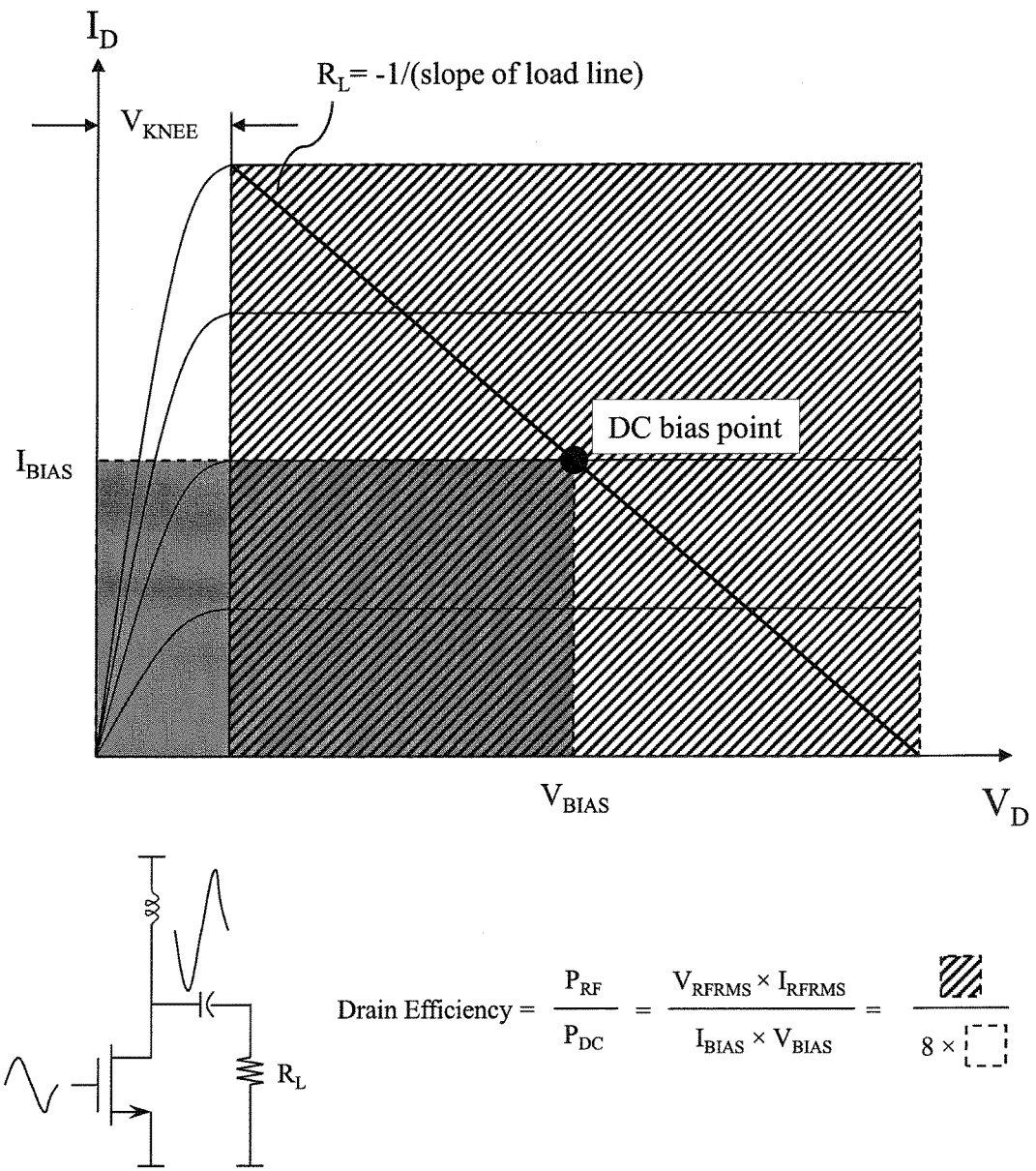
FIG. 3 shows an exemplary class A amplifier comprised of an FET with its accompanying current $I_D$ and voltage $V_D$ characteristics.

FIG. 3 shows an exemplary class A amplifier comprised of a field effect transistor (FET) with its accompanying current $I_D$ and voltage $V_D$ characteristics. When varying an input signal voltage applied to a gate of the FET, the output (drain) operating point of the FET moves along a load line, which is so named because a negative reciprocal of its slope is equal to a resistive value of a load impedance seen by the drain of the FET. A larger amount of power is delivered to the load impedance when the output voltage swings from peaks near a breakdown voltage to valleys at a knee voltage $V_{KNEE}$. Below the knee voltage, the amplifier is operating in the triode region and is not operating optimally as an amplifier. A person skilled in the art will notice that an amount of power equal to a product of the knee voltage and the DC bias current is normally lost.

As previously mentioned, a power amplifier may be evaluated based on efficiency of the power amplifier. By way of example, efficiency can be evaluated based on drain efficiency and/or power added efficiency (PAE). For discussion purposes, the term "efficiency" is used to refer to "drain efficiency". Drain efficiency can be calculated as a ratio of signal output power $P_{RF}$ of the amplifier to direct current (DC) power $P_{DC}$ fed to the drain of the amplifier. Signal output power $P_{RF}$ is calculated as a product of root mean square (RMS) voltage $V_{RFRMS}$ and RMS current $I_{RFRMS}$. DC power $P_{DC}$ is calculated as a product of voltage $V_{BIAS}$ and current $I_{BIAS}$ at a DC bias point.

With reference to FIG. 3, drain efficiency can be interpreted graphically as a ratio of one eighth of the area of the cross-hatched box to the area of the solid box shown in FIG. 3, as described in detail as follows. Width of the cross-hatched box is equal to twice the magnitude of the output (drain) voltage waveform, and height of the cross-hatched box is equal to twice the magnitude of the output (drain) current waveform. Power is calculated using RMS values of the voltage and current waveforms, which are equal to magnitude values divided by the square root of two. The combination of these factors leads to the factor of 8 in the denominator of the expression for drain efficiency shown in FIG. 3. As described above, equations for drain efficiency, signal power, DC power, RMS voltage, and RMS current can be given by, respectively:

Drain Efficiency=$P_{RF}/P_{DC}$ $P_{RF}=V_{RFRMS} \times I_{RFRMS}$ $P_{DC}=I_{BIAS} \times V_{BIAS}$ $V_{RFRMS}=V_{RFpk-pk}/(2*\text{sqrt}(2))$ $I_{RFRMS}=I_{RF}pk-pk/(2*\text{sqrt}(2))$ Alternatively, if $P_{RFin}$ denotes the signal input power, then the PAE equation is given by:

PAE=$(P_{RF}-P_{RFin})/P_{DC}$

By definition, a class A amplifier conducts current during 100% of a signal cycle of the input signal voltage $V_{RF}$. Although such an amplifier is highly linear, it exhibits lower drain efficiency than alternative configurations (e.g. class B, class AB, and class C, among others). These alternative configurations, which conduct current during less than 100% of the signal cycle, exhibit nonlinear operation and thus exhibit increased ACLR due to the higher nonlinearity, but generally demonstrate greater drain efficiency than the class A amplifier. Although example embodiments will be described primarily using an exemplary class A amplifier, the present disclosure can also be used with other amplifier classes as well.

Figure 4:
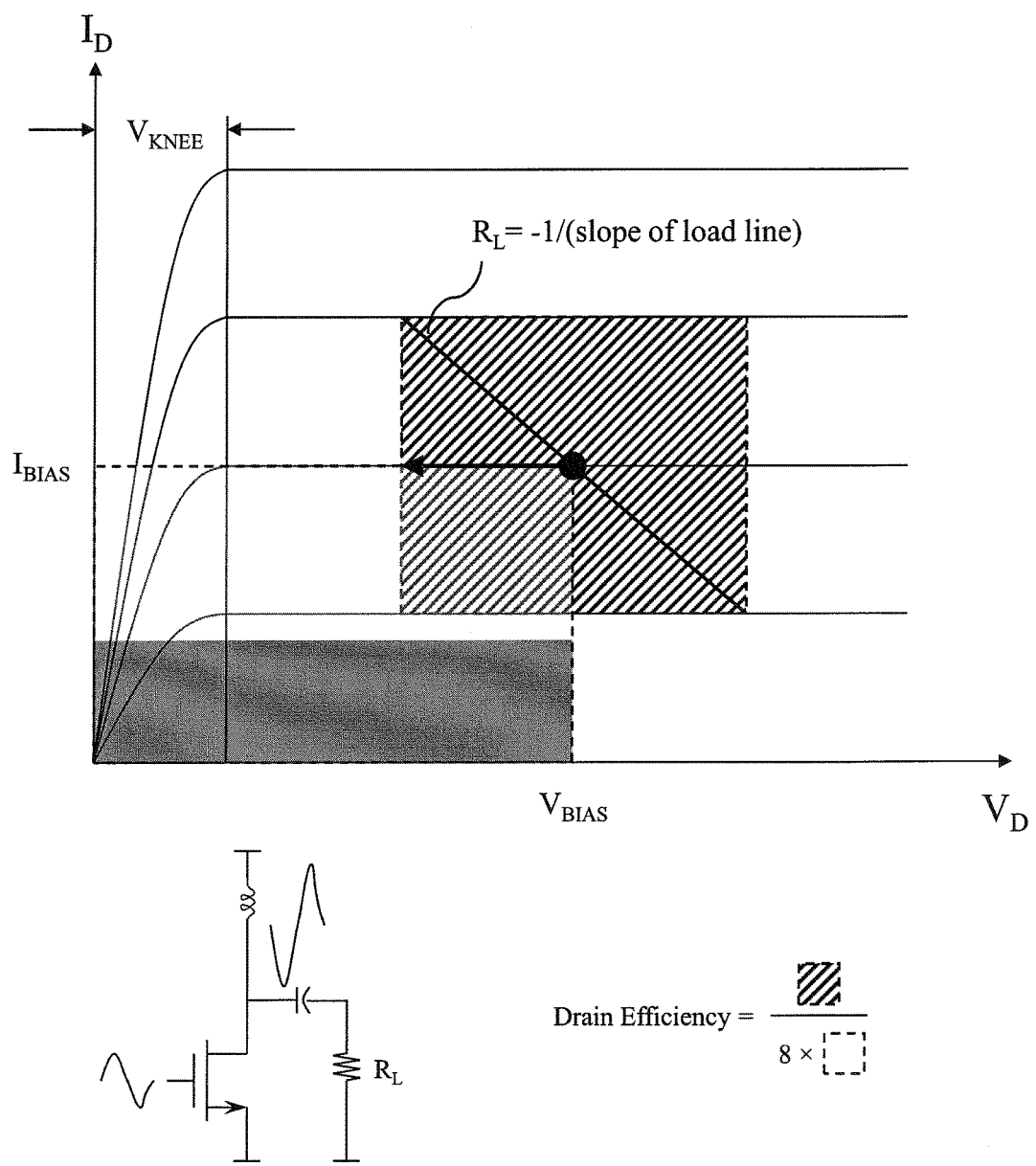
FIG. 4 shows current and voltage characteristics for a class A amplifier operating with reduced signal input.

FIG. 4 shows current and voltage characteristics for a class A amplifier operating at the same DC bias point ($V_{BIAS}$, $I_{BIAS}$) as FIG. 3 but with reduced signal input relative to FIG. 3. As a result, although the DC power $P_{DC}$ (area of the solid box) remains constant, the signal output power $P_{RF}$ (area of the cross-hatched box) has been reduced, leading to reduced drain efficiency.

Figure 5:
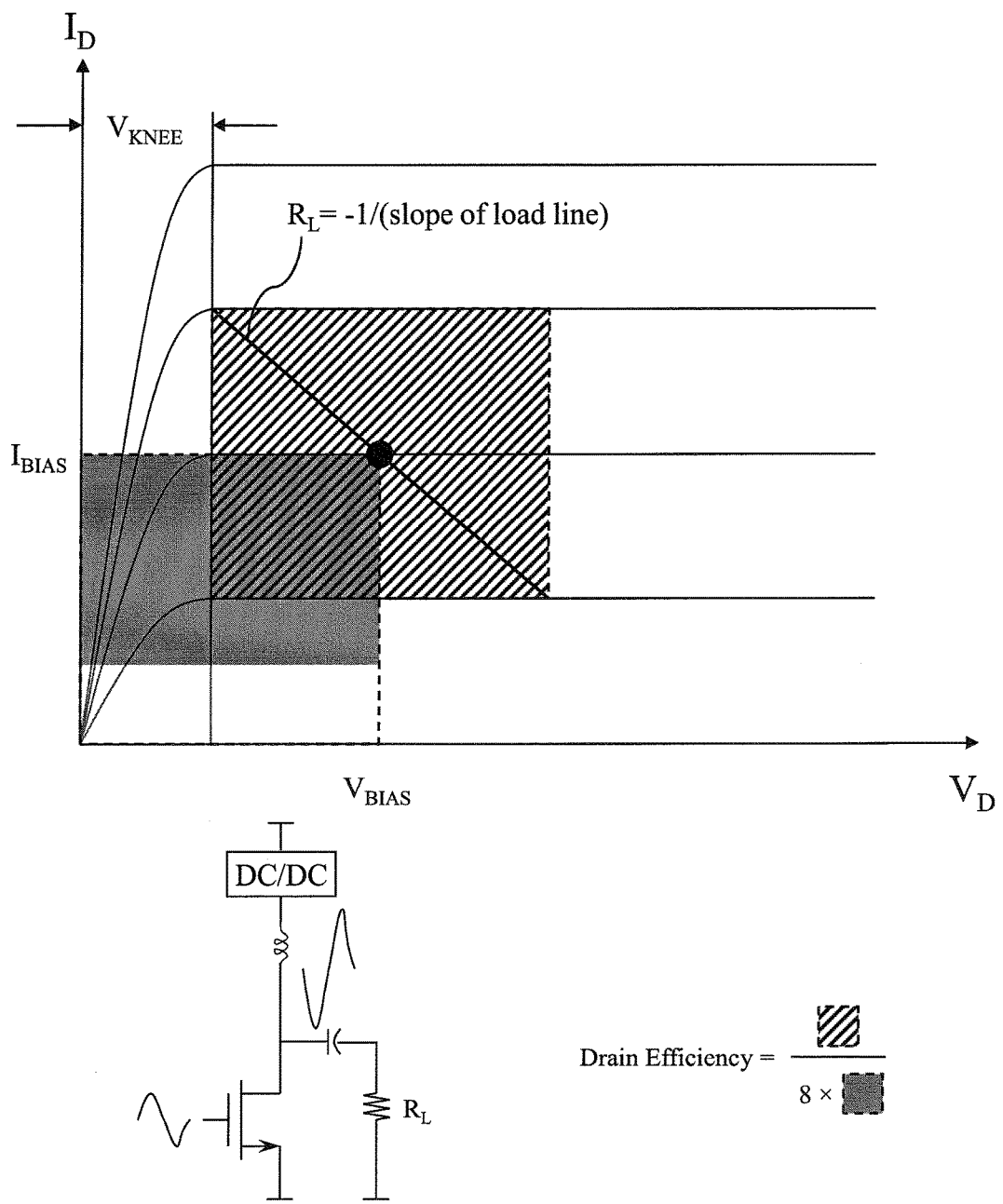
FIG. 5 shows voltage and current characteristics of an amplifier when a DC/DC converter is used to shift a DC bias point of the amplifier in response to reduced signal input.

For a given signal output power (i.e. for a constant area of the cross-hatched box), a technique for enhancing drain efficiency is to reduce DC voltage supplied to the drain of the power amplifier by using a DC/DC converter. In other words, the voltage value $V_{BIAS}$ of the DC bias point ($V_{BIAS}$, $I_{BIAS}$) can be reduced. This will shift the DC bias point to the left, reducing the DC power dissipated in the load connected to the output (drain) of the amplifier while maintaining the same signal output power. FIG. 5 shows voltage and current characteristics of an amplifier when a DC/DC converter is used to shift the DC bias point in response to reduced signal input.

Figure 6:
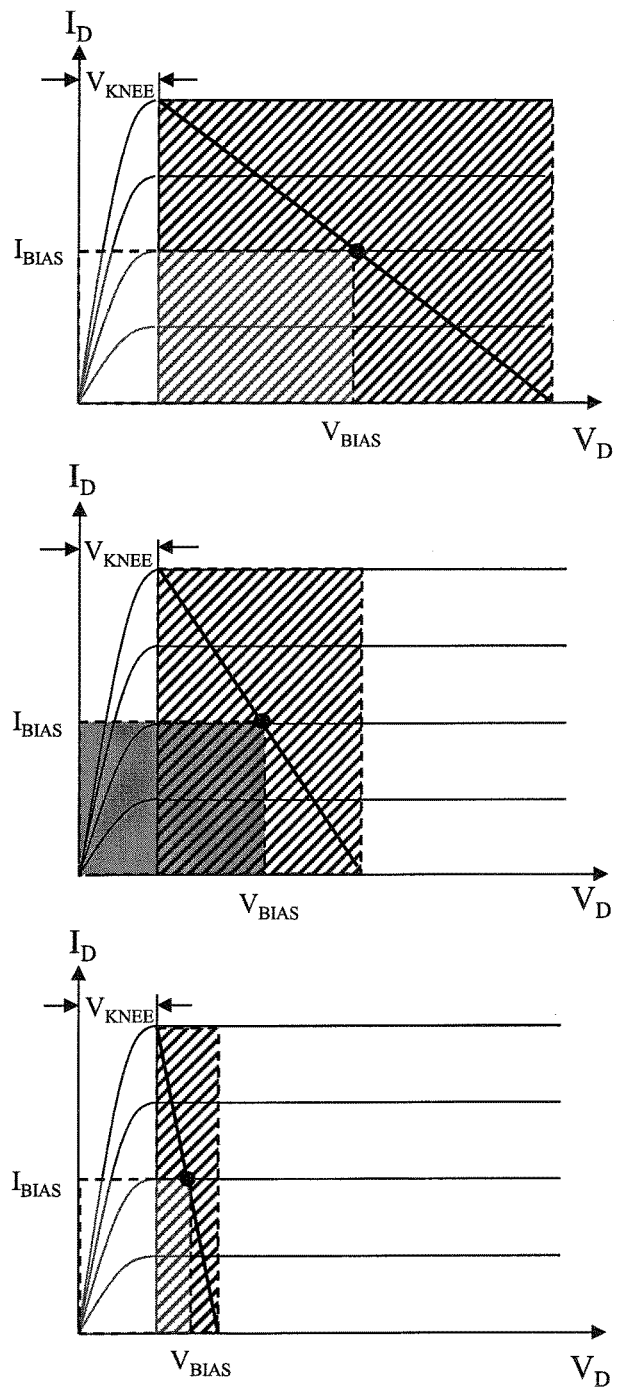
FIG. 6 shows voltage and current characteristics of an amplifier when slope of a load line is adjusted to have a steeper downward slope (corresponding to a lower load resistance) together with reducing drain voltage in response to a reduced signal input.
Figure 6:
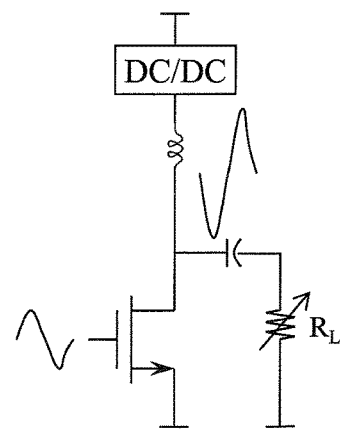

FIG. 6 shows voltage and current characteristics of an amplifier when the slope of the load line is adjusted to have a steeper downward slope (corresponding to a lower load resistance) together with reducing drain voltage in response to reduced signal input. With reference to the three graphs shown in FIG. 6, proceeding from the top graph to the middle graph, the load line is adjusted to have a steeper slope and the DC bias voltage $V_{BIAS}$ is reduced at the drain of the amplifier. Proceeding from the middle graph to the bottom graph, the load line is further adjusted to have an even steeper slope and the DC bias voltage $V_{BIAS}$ is further at the drain of the amplifier. Specifically, as shown in the three graphs of FIG. 6, the slope of the load line can be adjusted to have a steeper downward slope together with the aforementioned method of reducing drain voltage, a combination which can increase efficiency at a given delivered signal output power.

In proceeding from the top graph to the bottom graph of FIG. 6, load line adjustment is provided by a decrease in output impedance as shown in the steepening downward slope of the load line. In a case where DC bias voltage is reduced, efficiency can be increased through such load line adjustment because the area of each of the cross-hatched boxes can be optimized for that given DC bias voltage. For example, going from the top graph to the middle graph, if the output (drain) DC bias voltage $V_{BIAS}$ were reduced without adjusting the slope of the load line, the cross-hatched rectangle would have been smaller (similar to the graph shown in FIG. 5), corresponding to lower RF power output and thus lower efficiency relative to the case shown in the middle graph of FIG. 6.

With further reference to the decreasing of output impedance proceeding from the top graph to the bottom graph of FIG. 6, the decreased output impedance is normally transformed upwards to an impedance (e.g. 50Ω, a common impedance used in RF circuits) of a system containing the power amplifier, which can result in increased loss. As is well known, any impedance transformation with real components (e.g. resistance due to a finite quality factor) introduces loss. A higher transformation ratio due to the progressive decreasing of output impedance shown in FIG. 6 can result in higher loss relative to a case where the output impedance is kept constant. Consequently, such an example in FIG. 6 illustrates a tradeoff between loss and efficiency.

Figure 7A:
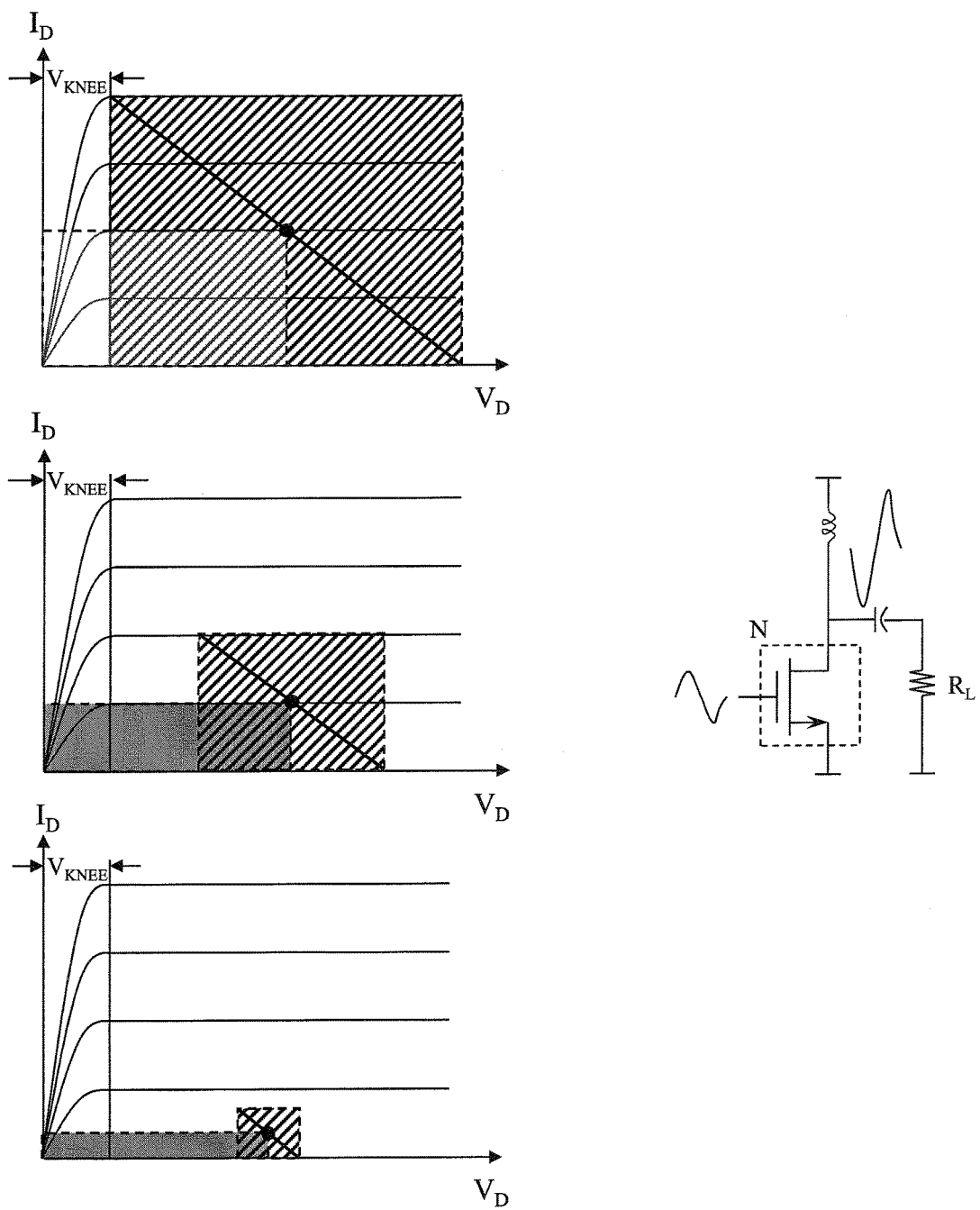
FIG. 7A shows current and voltage characteristics of an amplifier when bias current is reduced.

Instead of reducing DC bias voltage $V_{BIAS}$ to compensate for a reduced input signal drive, the reduced input signal drive can be compensated for by adjusting DC bias current $I_{BIAS}$. According to several embodiments of the present disclosure, the DC bias current $I_{BIAS}$ can be adjusted by reducing an effective size of the amplifier (to be explained as follows). FIG. 7A shows current and voltage characteristics of an amplifier when bias current $I_{BIAS}$ is reduced. The bias current $I_{BIAS}$ can be reduced by decreasing power amplifier size, where adjusting of the power amplifier size can be accomplished by designing the power amplifier to be comprised of N unit cells operating in parallel (i.e. unit cells see equal voltage) and selectively activating (e.g. turning ON) or deactivating (e.g. turning OFF) a subset of such unit cells to increase or decrease power amplifier effective size, respectively. Each unit cell can comprise one or more active devices (e.g. NMOSs) that are configured to operate as an amplifier. For purposes of discussion, the terms "size" and "effective size" of an amplifier are used interchangeably. The DC power dissipation, due to the product of the knee voltage and the DC bias current can be reduced because DC bias current is reduced.

If load impedance seen by the entire amplifier remains fixed (i.e. constant slope of the load line), then, for a reduced bias current $I_{BIAS}$, voltage swing seen by the entire amplifier will be reduced. The reduction in voltage swing is indicated graphically by a smaller width of the cross-hatched box as height decreases in FIG. 7A, proceeding from the top graph to the bottom graph. Unit cells of the power amplifier that remain active (e.g. ON) retain current density; that is, an individual unit cell that remains active will continue to conduct an equal amount of DC bias current. As used in the present disclosure, the current density of a unit cell may refer to a bias current conducted by a unit cell that is active (e.g. ON), assuming that each unit cell that is active conducts an equal amount of DC bias current.

It is advantageous to keep the bias current in each unit cell fixed as described, rather than decreasing the bias current in a fixed size amplifier because a decrease in bias current typically results in a decrease in amplifier's bandwidth capability represented by the transition frequency (ft) or maximum frequency of oscillation (fmax). The linearity of each unit cell is maintained in this way, as it will see the same bias conditions. It also keeps the transconductance (gm) constant and preserves the class of amplifier operation.

By way of example and not of limitation, consider an amplifier comprised of 60 unit cells, where each unit cell conducts 10 mA of DC bias current. In a case where all 60 unit cells are active, a total DC bias current of 600 mA can be conducted by the amplifier. The case where all 60 unit cells are active can correspond to the upper left graph of FIG. 7A. If 30 unit cells are deactivated, leaving 30 unit cells active, total DC bias current conducted by the power amplifier decreases to 300 mA, but each active unit cell can continue to conduct 10 mA of DC bias current. The case where 30 unit cells out of the total 60 unit cells remain active can correspond to the middle graph of FIG. 7A. If 15 more unit cells are deactivated, leaving 15 unit cells active, the total DC bias current conducted by the power amplifier decreases to 150 mA. The case where 15 unit cells out of the total 60 unit cells remain active can correspond to the bottom graph of FIG. 7A.

Figure 7B:
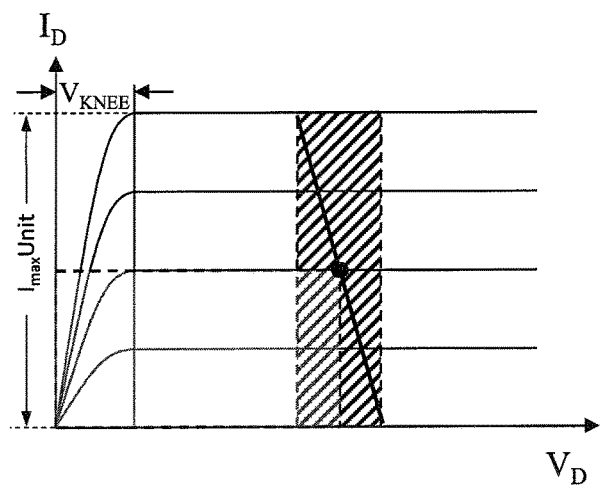
FIG. 7B shows current and voltage characteristics of an individual active unit cell of the amplifier of FIG. 7A. Note that the scale of current on the y-axis is shown for the unit cell, not the full size structure of FIG. 7A.
Figure 7B:
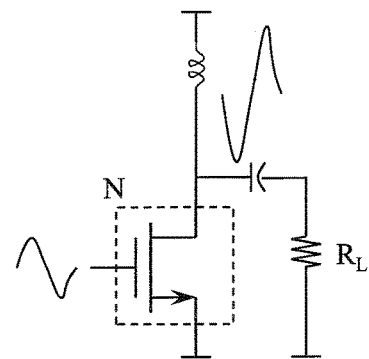

For a constant load impedance and DC bias voltage, the reduced DC bias current also results in reduced DC power dissipation as indicated by reduced sizes of the solid box proceeding from the top graph to the bottom graph of FIG. 7A. Because the DC bias current per unit cell remains constant while voltage swing is reduced, individual unit cells that remain active see a reduced output impedance when other unit cells are turned off, as indicated graphically by a steeper slope of the load line in the graph of FIG. 7B.

It is noted that in some embodiments, unit cells that remain active do not necessarily retain current density; that is, DC bias current in each unit cell that remains active can vary. A person skilled in the art could readily perform experiments with varying DC bias current of each unit cell to achieve desired operating characteristics (e.g. linearity, ACLR, output power, drain current, out of band emissions, Rx band noise, error vector magnitude (EVM), and so forth). For purposes of discussion only, it is generally assumed that each active unit cell conducts an equal amount of bias current.

Figure 8B:
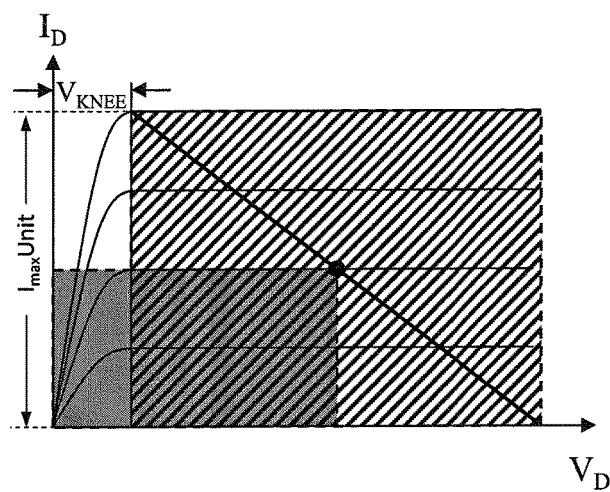
FIG. 8B shows current and voltage characteristics of an individual active unit cell of the amplifier of FIG. 8A. Note that the scale of current on the y-axis is shown for the unit cell, not the full size structure of FIG. 8A.
Figure 8B:
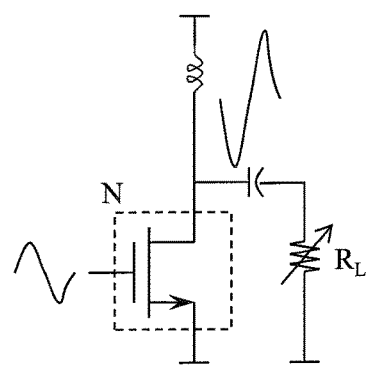
Figure 8A:
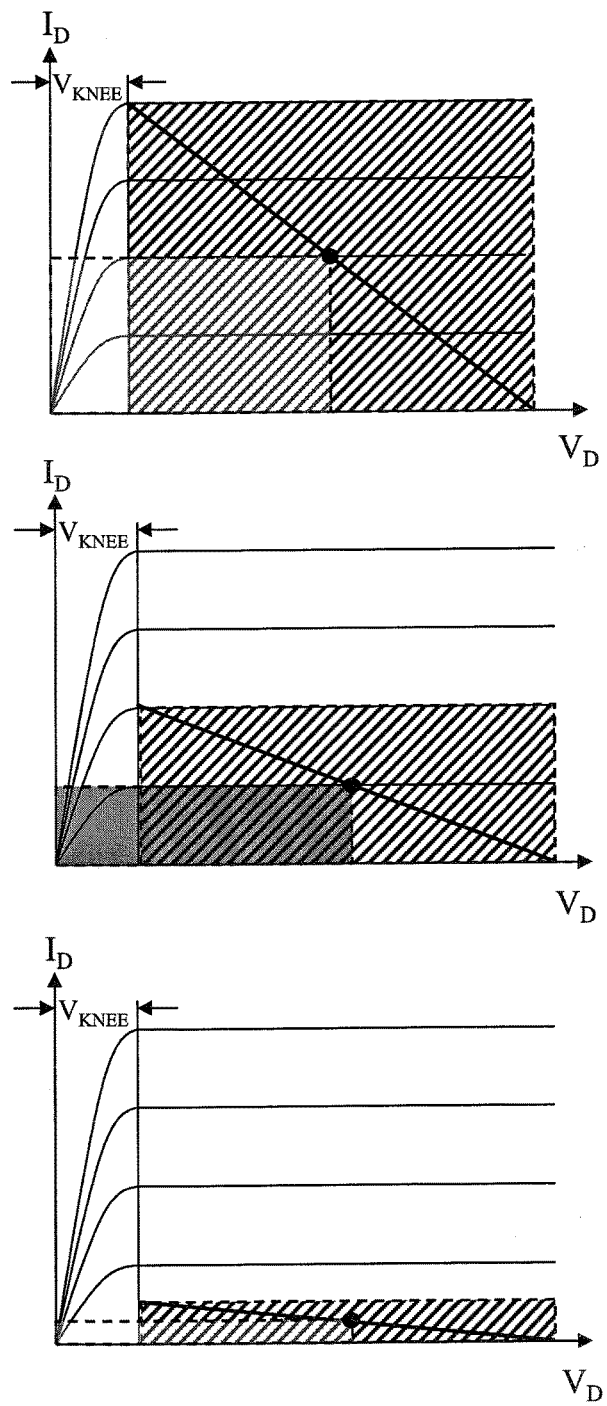
FIG. 8A shows current and voltage characteristics of an amplifier when bias current is reduced and load impedance seen by the entire power amplifier is increased.
Figure 8A:
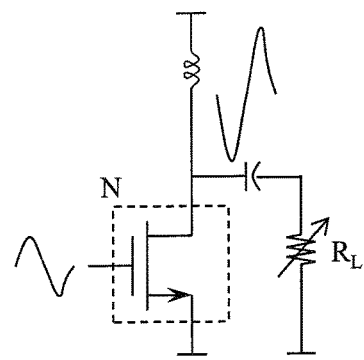

FIG. 8A shows current and voltage characteristics of an amplifier when bias current is reduced and load impedance seen by the entire power amplifier (i.e. N unit cells taken as a unit rather than individually) is increased. Similar to the discussion with respect to FIG. 7A, size of the power amplifier can be adjusted by designing the power amplifier to be comprised of one or more unit cells operating in parallel (i.e. unit cells see equal voltage) and selectively activating or deactivating a subset of such unit cells to increase or decrease power amplifier effective size, respectively. Reduction of bias current of the power amplifier can be achieved through a decreasing of power amplifier size.

The topmost graph of FIG. 8A can correspond to an exemplary case where all unit cells are active. The middle graph of FIG. 8A can correspond to an exemplary case where some unit cells have been deactivated (thus reducing DC bias current) in combination with increasing load impedance seen by the entire power amplifier (i.e. N unit cells taken as a unit rather than individually). The bottom graph of FIG. 8A can correspond to an exemplary case where even more unit cells have been deactivated (thus further reducing bias current) in combination with further increasing the load impedance seen by the entire power amplifier. FIG. 8B shows current and voltage characteristics present at the drain of one of the unit cells that remains active.

If the load impedance seen by the entire power amplifier is increased, although total DC bias current flowing through the entire power amplifier is reduced, voltage and current swing of any individual active unit cell can remain constant. As an example, a typical PA output impedance is 3Ω, which is then matched to a load (e.g. 50Ω, a common impedance used in RF circuits). Increasing the load impedance at an output of the power amplifier, relative to the typical PA output impedance of 3Ω, can reduce the transformation ratio, thereby reducing loss. This load impedance adjustment corresponds to a shallower downward sloping load line than the slope of the load line prior to such load impedance adjustment. Through such load impedance adjustment, while total current output of the power amplifier can be reduced by deactivating (e.g. turning OFF) some unit cells, individual unit cells that remain active (e.g. ON) do not see a change in either individual current or voltage swing, as shown in FIG. 8B. The individual unit cells that remain active see a constant output impedance as represented by the negative reciprocal of the slope of the load line.

Also note that, because the area of the cross-hatched box (proportional to RF power) decreases by a percentage equal to the percent decrease of the area of the solid box (proportional to DC power), a ratio of RF power to DC power can remain constant. As mentioned previously, efficiency is generally proportional to the ratio of RF power to DC power. As a result, even at differing power levels of the power amplifier (as set based on number of active unit cells in the power amplifier), efficiency of the power amplifier whose voltage and current characteristics are shown in FIG. 8A can remain constant. As shown in FIG. 8B, another interpretation is that because voltage and current characteristics for each individual unit cell that remains active can remain constant, efficiency of each individual unit cell that remains active also can remain constant. Therefore, efficiency of the power amplifier whose voltage and current characteristics are shown in FIG. 8A can remain constant even as number of unit cells that are active (or inactive) is varied during operation of the power amplifier.

According to several embodiments of the present disclosure, a scalable periphery tunable matching (SPTM) power amplifier can achieve the twin effects shown in FIGS. 8A and 8B of selectively activating or deactivating unit cells to adjust current (and therefore output power) while adjusting the load line corresponding to impedance seen by the entire power amplifier (i.e. N unit cells taken as a unit rather than individually) in such a manner that unit cells remaining active do not see an individual change in output impedance and corresponding load line slope. As used in the present disclosure, the scalable periphery (SP) aspect of the power amplifier refers to ability to activate or deactivate unit cells within the power amplifier. The tunable matching aspect of the power amplifier refers to ability to adjust the load line corresponding to the output impedance seen by the power amplifier. Tunable matching networks are shown, for example, in U.S. Pat. No. 7,795,968, which is incorporated herein by reference in its entirety.

Figure 9A:
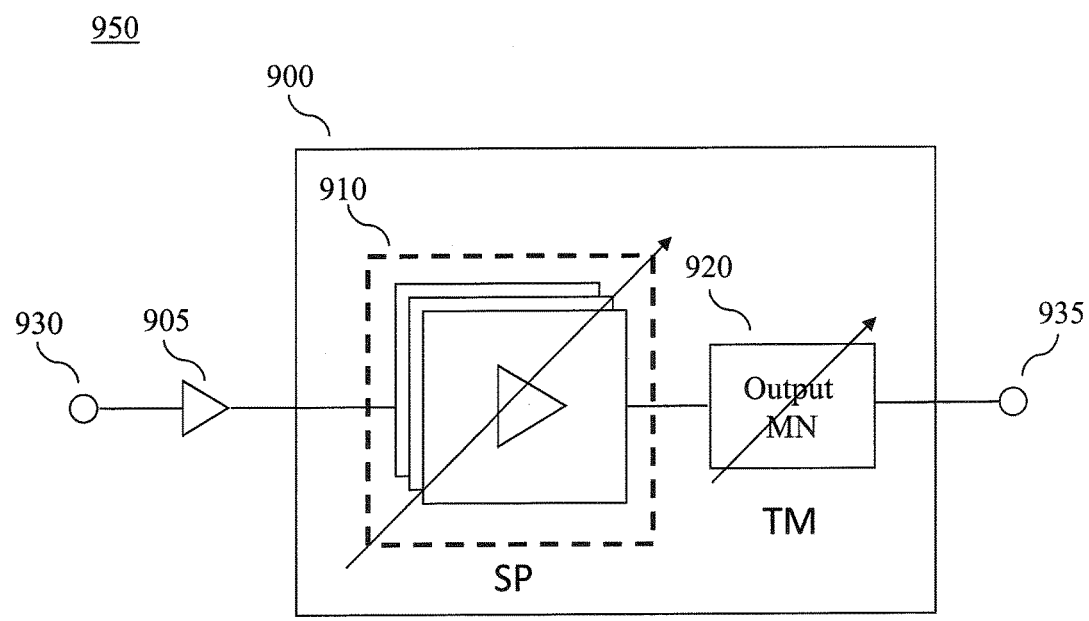
FIGS. 9A-9C show an exemplary scalable periphery tunable matching power amplifier architecture comprising a scalable periphery amplifier and a tunable matching network.

FIG. 9A shows an exemplary SPTM power amplifier architecture (950). A similar architecture can also be found in U.S. Pat. No. 7,170,341, issued on Jan. 30, 2007 and entitled "Low Power Consumption Adaptive Power Amplifier", which is incorporated herein by reference in its entirety. By way of further example, and not of limitation, the SPTM power amplifier of FIG. 9A can further comprise a tunable matching network (920) connected to the output of the scalable periphery amplifier (910). Such a tunable matching network (920) can be configured to dynamically adjust the output impedance seen by the SP amplifier (910), increasing the output impedance (adjusting load line for shallower slope) when unit cells are deactivated or decreasing the output impedance (adjusting load line for steeper slope) when more unit cells are activated. The SPTM power amplifier architecture (950) of FIG. 9A is adapted to be connectable between a first terminal (930) and a second terminal (935). The SPTM power amplifier architecture (950) comprises a driver (905) configured to receive and process a signal from the first terminal (930); a scalable periphery (SP) amplifier (910) connected with the driver (905) and configured to amplify a signal output from the driver (905); and a tunable matching network (920) connected with the SP amplifier (910) and configured to dynamically adjust output impedance seen by the SP amplifier (910). The SP amplifier (910) and the tunable matching network (920) together form what is referred to as an SPTM power amplifier (900). Although the SPTM power amplifier (900) may be adapted to amplify an output signal from a driver (905), as shown in FIG. 9A, the driver (905) is optional and may be removed from FIG. 9A. As used in the present disclosure, a driver or driver circuit may refer to an amplifier that precedes and drives (e.g. provides an output signal to) another amplifier. The person skilled in the art will understand that for added flexibility, the driver may also be configured as an SPTM amplifier similar in architecture to (900).

According to several embodiments of the present disclosure, the SP amplifier (910) can comprise one or more unit cells operating in parallel. Each of the unit cells can comprise one or more active devices (e.g. transistors) that can be configured to operate as any class of amplifier (e.g. class A, class B, class AB, class C, class D, class E, class F, etc.). The number of unit cells to be activated or deactivated can be determined as follows. Given an input power (e.g. usually measured in milliwatts) provided to an SP amplifier and a desired power gain (e.g. usually measured in dB), an expected output power of the SP amplifier can be calculated according to techniques known to a person skilled in the art. Because the output power is proportional to an area of the cross-hatched regions as illustrated in previous figures (e.g. FIG. 3), the expected output power can be used to determine a necessary DC bias current. Based on the necessary DC bias current, a minimum number of unit cells capable of delivering the necessary DC bias current can be determined and in turn the number of unit cells to be turned ON can be determined based on this minimum.

For the exemplary architecture (950) shown in FIG. 9A, the SP amplifier (910) can be constructed with any number of unit cells operating in parallel. The SP amplifier (910) can be constructed in a manner so as to allow each unit cell to be switched ON or OFF individually. In many embodiments of the present disclosure, the switching circuitry can be constructed using CMOS technology and various architectures known to the skilled person, such as, for example, the architecture presented in U.S. Pat. No. 7,910,993, issued on Mar. 22, 2011 and entitled "Method and Apparatus for use in Improving Linearity of MOSFET's using an Accumulated Charge Sink", and in U.S. Pat. No. 6,804,502, issued on Oct. 12, 2004 and entitled "Switch Circuit and Method of Switching Radio Frequency Signals", both of which are incorporated herein by reference in their entirety. Individual unit cells can be constructed using CMOS, silicon germanium (SiGe), gallium arsenide (GaAs), gallium nitride (GaN), bipolar transistors, or any other viable semiconductor technology and architecture known, including one described in U.S. Pat. No. 7,910,993, to or which can be envisioned by a person skilled in the art. Total DC bias current and current output of the SP amplifier (910) can be adjusted by selectively switching ON or OFF individual unit cells. In some embodiments of the present disclosure, unit cells can be arranged around a periphery of a selected area of a circuit.

Figure 9B:
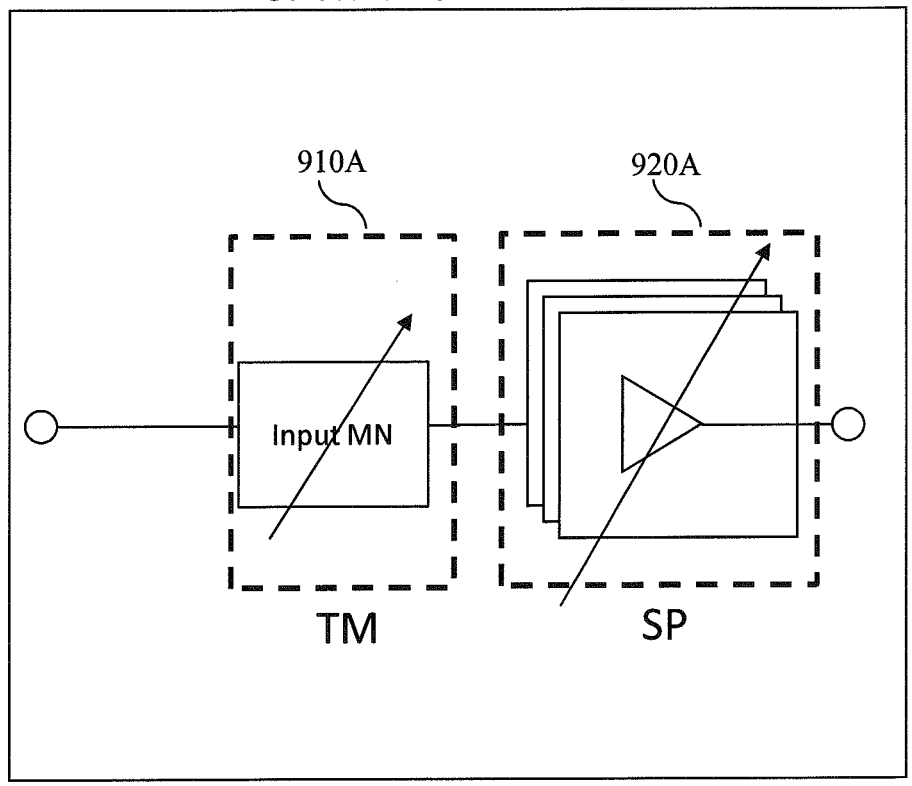

FIG. 9B shows an SP amplifier with the tunable matching circuit at the input. While this approach may not provide all of the benefits of changing the load line of the amplifier, it does help keep the input impedance constant as the number of active cells changes. Note that SP without TM can provide benefits above those of a standard amplifier.

Figure 9C:
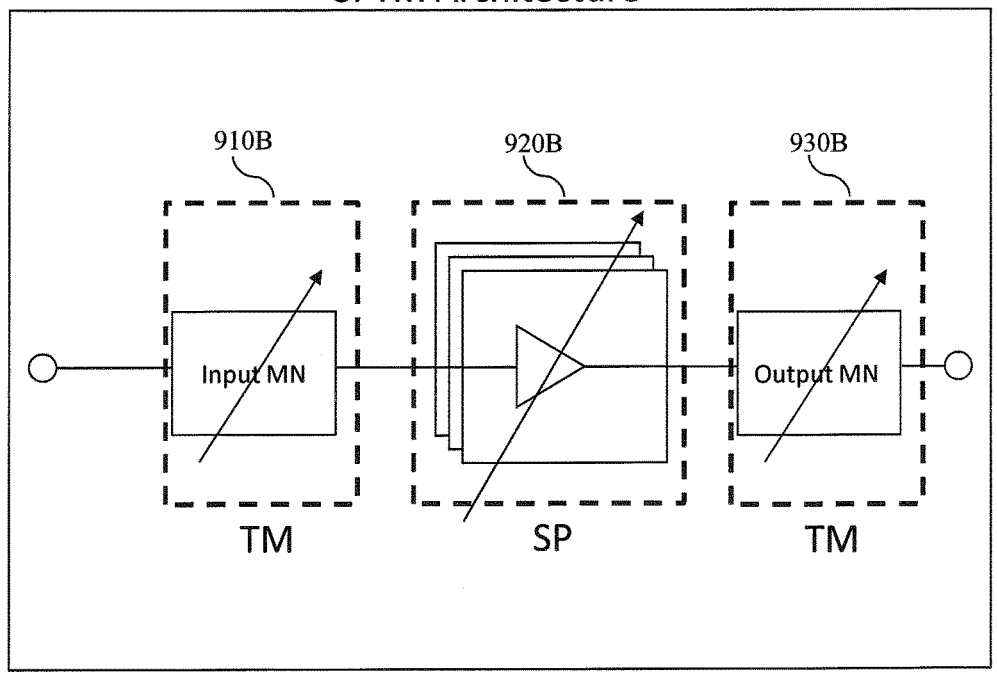

FIG. 9C shows a combination of an SP amplifier with TM at the input and output. Such embodiment offers all the SPTM benefits plus adding a benefit of improved input matching. The tunable match not only adjusts load lines and compensates for changes in the SP amplifier, it is also used to adjust the frequency response.

Figure 10A:
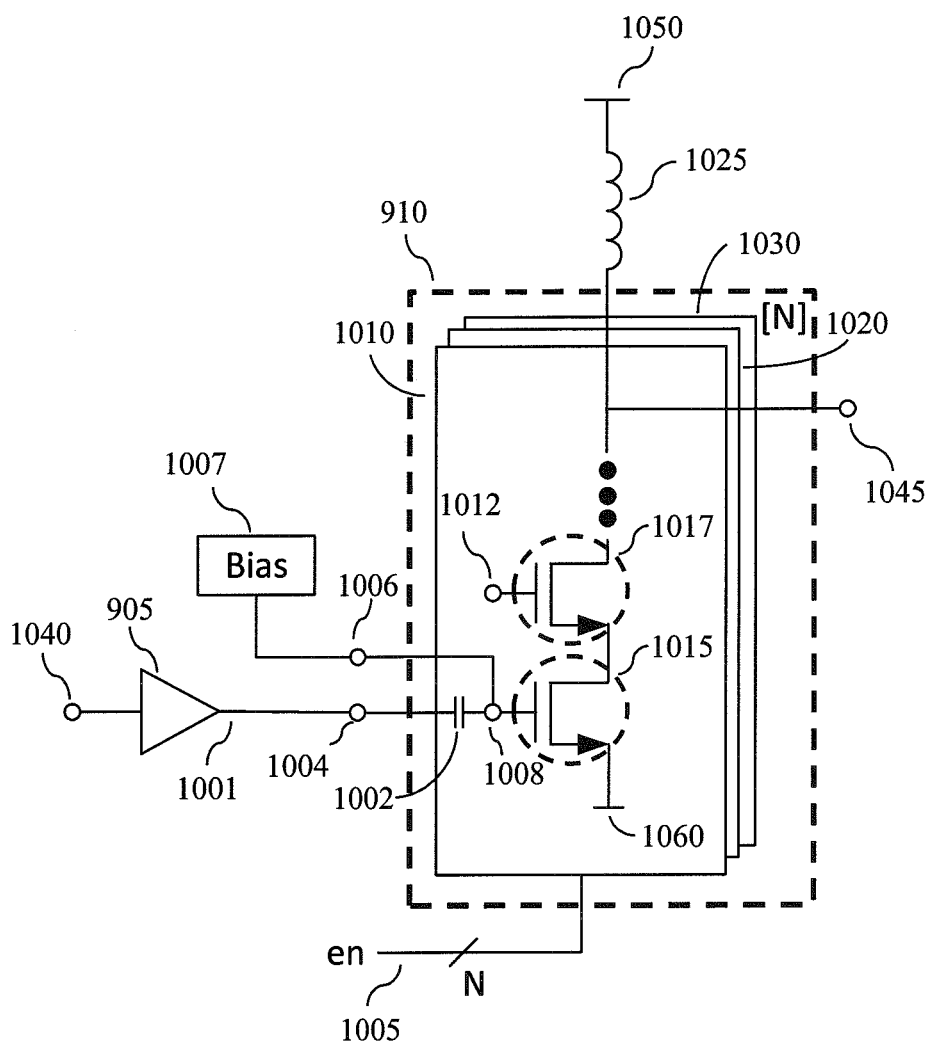
FIG. 10A shows an exemplary arrangement of unit cells of the scalable periphery amplifier shown in FIGS. 9A-9C.

If it is assumed that the unit cells of the SP amplifier (910) are numbered 1 through N, where N is the total number of unit cells, activation and deactivation can proceed in a deterministic manner. If a first power level requires that 5 unit cells be active, unit cells 1 through 5 can be turned ON while other unit cells remain OFF. If a second power level requires that 10 unit cells be active, unit cells 1 through 10 can be turned ON while other unit cells remain OFF. FIG. 10A shows an exemplary arrangement of unit cells (1010, 1020, 1030) of the scalable periphery amplifier (910) shown in FIG. 9A. A control word comprising one or more enable signals can be utilized to selectively activate or deactivate the unit cells (1010, 1020, 1030). In a case where each unit cell (1010, 1020, 1030) can be controlled independently of one another, each unit cell (1010, 1020, 1030) can be selectively activated or deactivated by a corresponding enable signal (1005) applied to the unit cell (1010, 1020, 1030). Each unit cell (1010, 1020, 1030) can comprise one or more active devices that can be configured to operate as any class of amplifiers. In the particular example arrangement shown in FIG. 10A, each unit cell (1010, 1020, 1030) comprises a stack of two or more transistors (1015, 1017), although in some embodiments a unit cell may comprise a single transistor. A supply voltage (1050) can be connected to each unit cell (1010, 1020, 1030) through an inductor (1025), where the inductor (1025) is commonly referred to as an RF choke. A source terminal of the first transistor (1015) can be connected to ground (1060).

According to several embodiments of the present disclosure, the unit cells (1010, 1020, 1030) can be designed and constructed to have identical characteristics (e.g. transconductance, bias voltages, physical size, and so on). Furthermore, the unit cells (1010, 1020, 1030) can be biased identically. With reference to FIG. 10A, a first FET (1015) of each unit cell (1010, 1020, 1030) can be biased identically and a second FET (1017) of each unit cell (1010, 1020, 1030) can be biased identically (and differently from the first FET).

In alternative embodiments, the unit cells (1010, 1020, 1030) may be biased differently and/or may be constructed to have different characteristics (e.g. transconductance, bias voltages, physical size, and so on). For example, consider an SP amplifier that comprises a first set of two unit cells, each constructed identically and biased at 20 mA of DC current, and a second set of four other unit cells, each constructed identically and biased at 10 mA of DC current. An output power level requiring 40 mA of DC bias current can be enabled by selectively activating either each unit cell in the first set of two unit cells or each unit cell in the second set of four unit cells. Alternatively, with reference to the same example, the same output power level requiring 40 mA of DC bias current can be enabled by selectively activating one unit cell from the first set of unit cells in conjunction with two unit cells from the second set of unit cells.

With reference back to FIG. 10A, the circuit shown in FIG. 10A comprises a first terminal (1040) coupled to an optional driver (905) and a second terminal (1045) coupled to the SP amplifier (910), where the first terminal (1040) is adapted to receive an input signal to be amplified by the SP amplifier (910) and the second terminal (1045) is adapted to receive an output signal of the SP amplifier (910). An output of the driver (905) at a node (1001) can be fed to an input node (1004) of the SP amplifier (910). An input signal at the input node (1004) of the SP amplifier (910) is in turn fed to each unit cell (1010, 1020, 1030) of the SP amplifier through an input coupling capacitor (1002) at the input of each unit cell. The input coupling capacitor (1002) allows an RF signal to pass from node (1001) to the input of each unit cell of the SP amplifier (910) while blocking a DC component of the input signal at node (1040). The input coupling capacitor (1002) of each unit cell of the SP amplifier (910) is coupled to a gate of a first transistor (1015) in the stack of each unit cell (1010, 1020, 1030), while an output signal may be taken from a last (e.g. transistor farthest from the first transistor) transistor in the stack of each unit cell (1010, 1020, 1030). In the particular case where the unit cell comprises a single transistor, then a corresponding output signal is taken from the same transistor to which the input signal is applied.

A bias network (1007) is connected to the bias input node (1006) of the SP amplifier (910), which is in turn routed to a node (1008) of each unit cell connected to the gate of the first (e.g. input) transistor of the stack. The bias network (1007) can be a standard bias network that would be known to a person skilled in the art and, although not explicitly shown in FIG. 10A, the bias network (1007) can supply bias voltages to gates of transistors above the first transistor (1015) in the stack, such as supply a bias voltage to the gate (1012) of transistor (1017) in FIG. 10A. Alternatively, node (1012) can be connected to a separate bias network (not shown) and supply a bias voltage to transistor (1017) via this separate bias network. Gate bias voltages of FETs generally have a direct effect on bias current. If the unit cell (e.g. 1010) comprises more than two transistors, gates of these other transistors can also be connected to bias networks as appropriate. The source of transistor (1015) can be connected to ground (1060) as shown in FIG. 10A or other circuits, which will be understood by those skilled in the art.

It is to be noted that the skilled person will know other stacked amplification structures and may use these in lieu of the one suggested in FIG. 10A and adapt the method herewith described to create an SP amplifier to such structures. FIG. 10F represents such a structure, wherein the stack is composed of P-type and N-type MOSFET devices in a push-pull configuration. In this configuration the top of the stack may comprise a number of P-type MOSFET devices connected in a series configuration, and the bottom may comprise the same number of N-type MOSFET devices also connected in a series configuration. The middle two devices are thus of opposite types and interconnected at their drain terminals. In this embodiment the input RF is fed to the top and bottom devices which in turn propagate the input through the top and bottom halves of the stack in a complementary fashion, yielding in outputting the amplified RF output signal from one half of the stack or the other half of the stack. In some embodiments both halves may output simultaneously but at different power levels. In some other embodiments output symmetry of the push-pull arrangement can be modified by switching off a number of P-type or N-type devices of the stack. Biasing of the gates may be provided via biasing terminals (1012, 1013). The person skilled in the art will understand that each of the transistors (1015, 1016, 1017, 1018) of FIG. 10F may be replaced by a cascode configuration for higher RF output power capability. Cascode amplifiers refer to common gate amplifier stages that are placed at the output of a common source amplifier. Cascode stages increase gain by increasing the output resistance, improve the frequency response by mitigating the Miller capacitance effect in the common source stage, and can improve voltage handling by dividing the voltage across the common gate and common source stages. Similarly, the person skilled in the art may envision a differential implementation of this embodiment, using transistors, cascode stages or even push-pull arrangements as active elements of the unit cells.

Figure 10B:
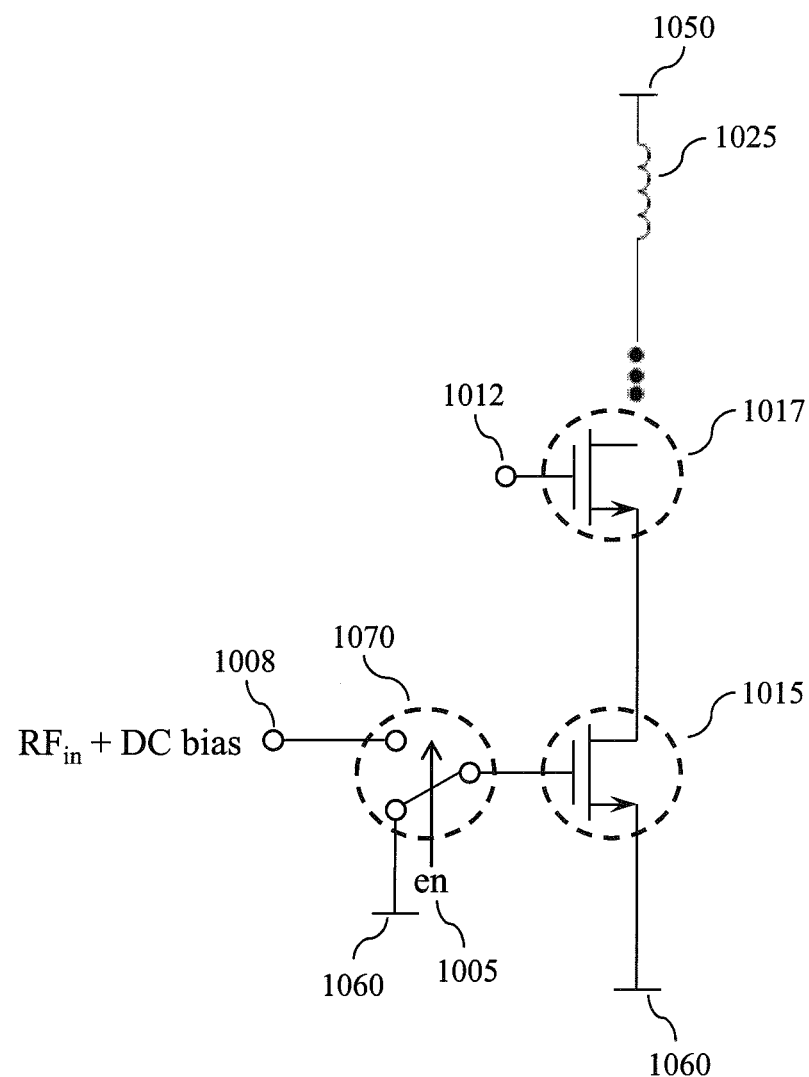
FIGS. 10B-10D show embodiments of a unit cell of the scalable periphery amplifier of FIGS. 9A-9C.
Figure 10C:
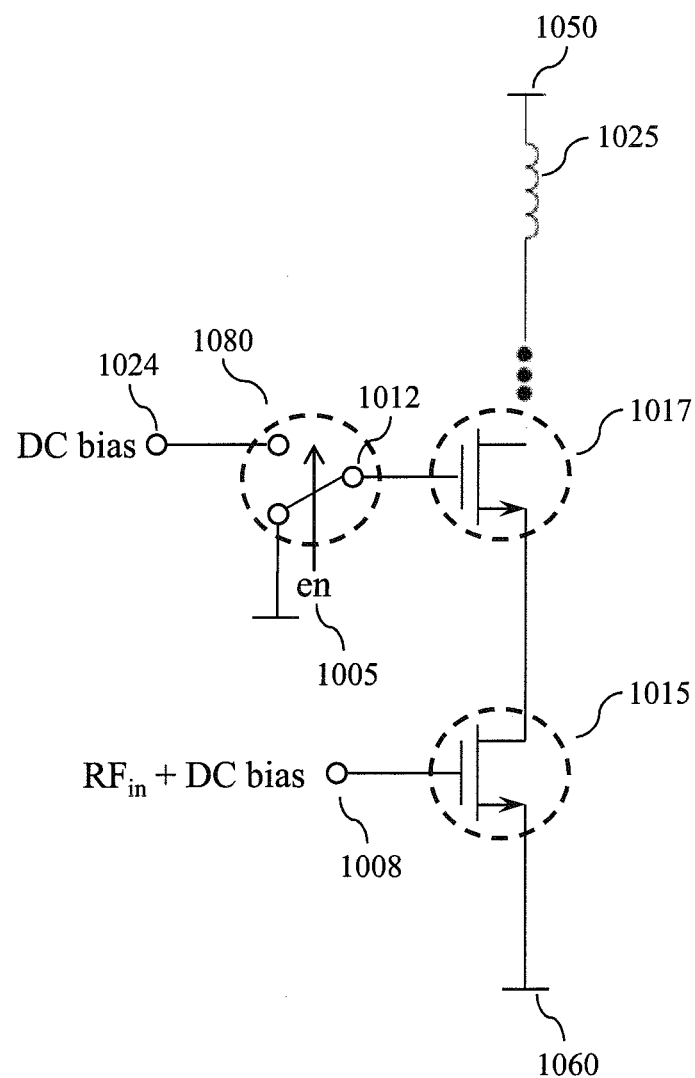
Figure 10D:
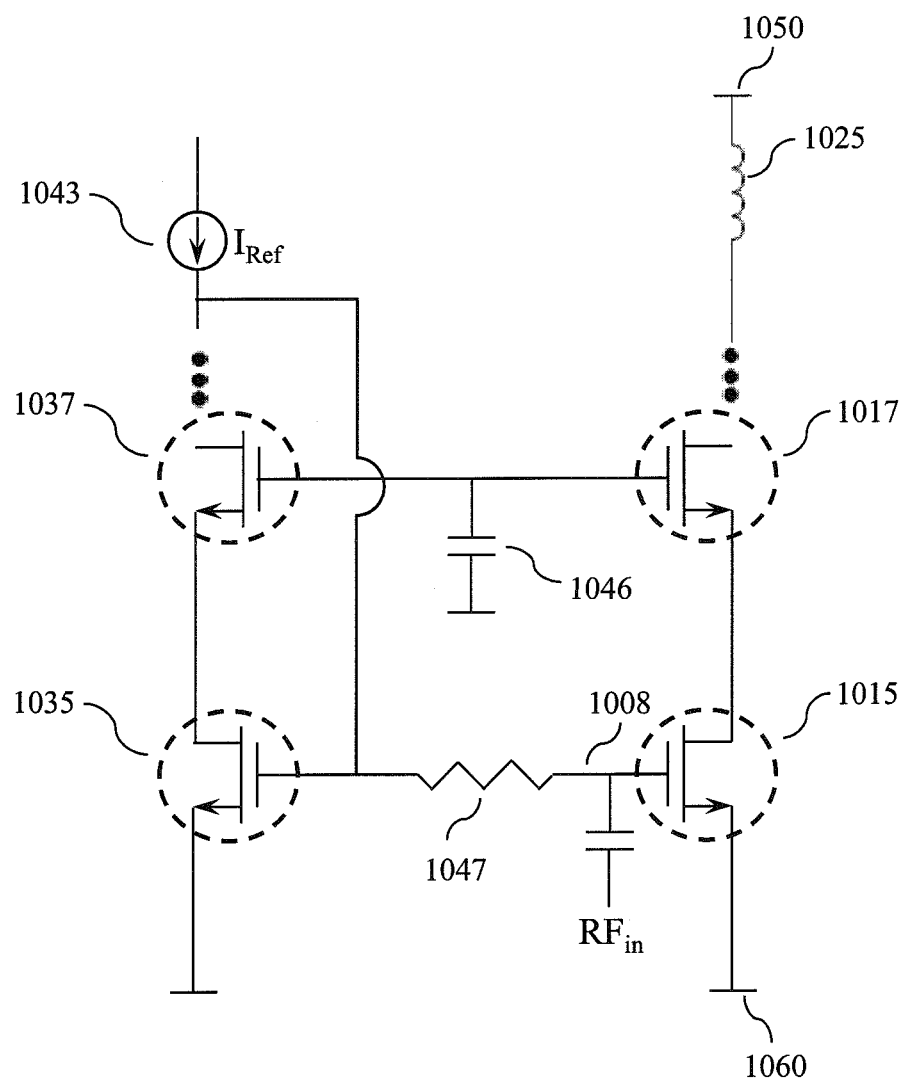
Figure 10E:
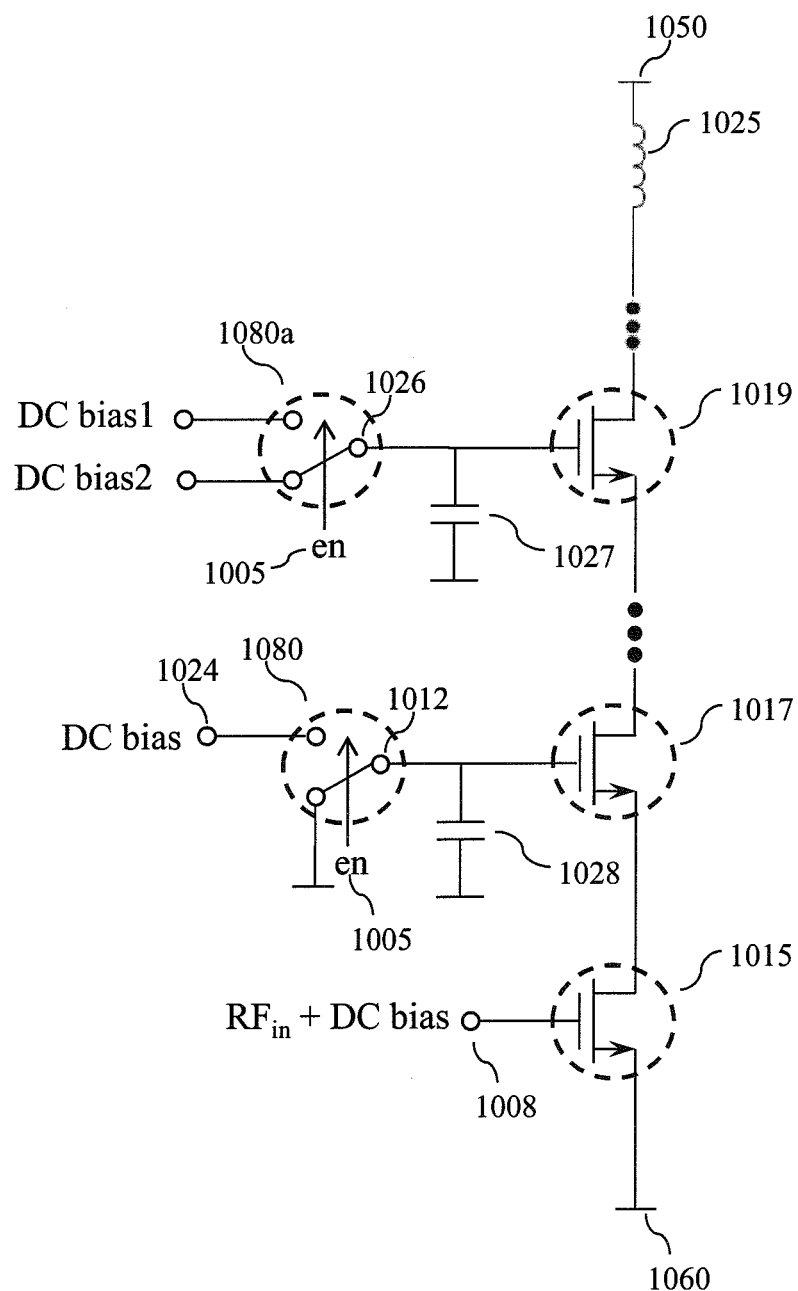
FIG. 10E shows an exemplary embodiment wherein a capacitor at a gate of a transistor and a bias voltage adjustment allow for equalization of voltages across the stack of transistors.
Figure 10F:
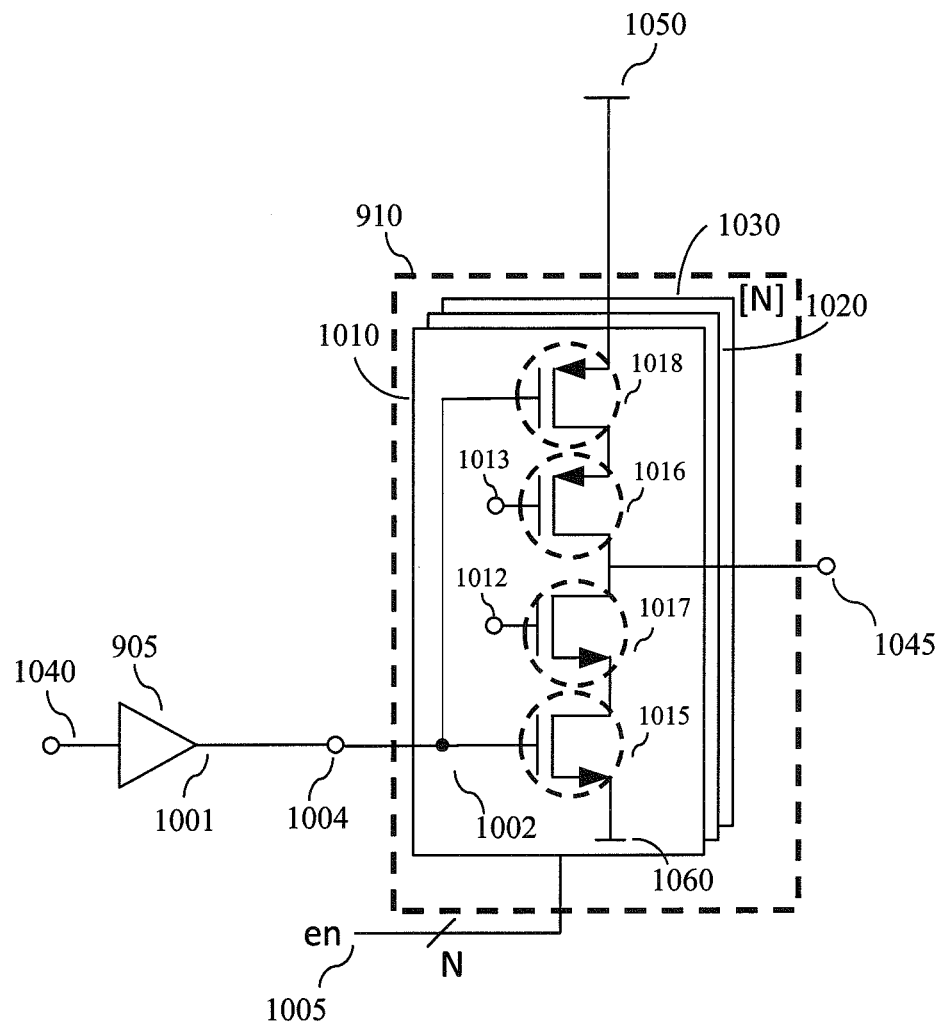
FIG. 10F shows an exemplary embodiment wherein the stack of transistors comprises N-type and P-type transistors.
Figure 10G:
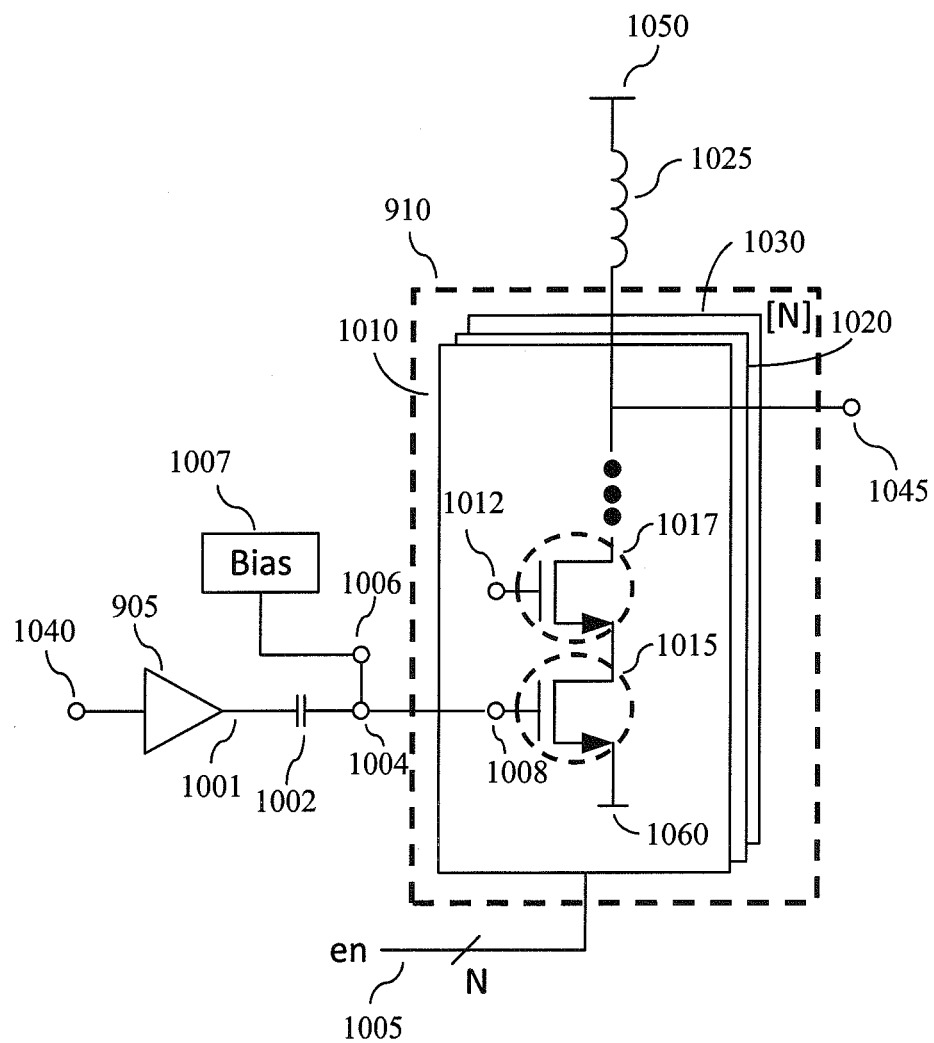
FIG. 10G shows an alternative embodiment of FIG. 10A wherein a coupling capacitor in the RF input path to the amplifier is not integrated within each unit cell.

While placing the input coupling capacitor (1002) within each unit cell may have the advantage of using smaller capacitor sizes (one for each unit), in some embodiments it may be desirable to place a single common input coupling capacitor outside of the unit cells as depicted by FIG. 10G, wherein a single input coupling capacitor is placed outside the SP amplifier (910). In such a configuration, bias input node (1006) and SP input node (1004) can be common, as depicted by FIG. 10G, or alternatively and for added flexibility in providing differing biases to the input transistors (1015) of each unit cell, these nodes may be separated as shown in FIG. 10A (thus routing the node (1006) of FIG. 10G to node (1008) in lieu of node (1004)).

FIGS. 10B and 10C show embodiments of a unit cell of the scalable periphery amplifier (910) of FIG. 9A. In these embodiments, an individual unit cell can comprise a stack of transistors (1015, 1017). In the embodiment shown in FIG. 10B, an individual unit cell comprises a switch (1070)

whose state is controlled by a control signal (1005). When an individual unit cell is ON, the switch (1070) can couple an RF signal and a bias signal to the gate of the first transistor (1015). When an individual unit cell is OFF, the switch (1070) can couple the gate of the first transistor (1015) to ground. Consequently, an individual unit cell can be turned OFF by cutting RF drive to and grounding the gate of the first transistor in the stack via the switch (1070), or vice versa in the case that the individual unit cell is being turned ON. As already mentioned above, the stack may comprise a single transistor, in which case the first transistor is the only transistor of the stack.

In the embodiment shown in FIG. 10C, an individual unit cell can be turned OFF by grounding the gate of a second transistor (1017) in the stack via a switch (1080), which is not in the path of the RF signal. To turn ON the individual unit cell, the switch (1080) can be operated to connect the gate of the second transistor (1017) in the stack to a DC bias voltage applied at node (1024). In other embodiments, the stack can be turned OFF by grounding (e.g. via a switch) higher (e.g. third or above) FETs in the stack, thus reducing capacitance. This can result in higher stress on devices in the stack due to unequal voltage division.

It is desirable to control the stress on the individual devices in the stack due to unequal voltage division across the devices (e.g. $V_{DS}$ of each device) which may subject any one of the devices to a voltage close to or larger than its limit breakdown voltage. As such, in some embodiments, the gates of the devices in the stack, with the exception of the input device (e.g. bottom device of FIG. 10A), are configured to float via insertion of a gate capacitor (1027, 1028) as depicted in FIG. 10E. The value of the gate capacitor is chosen so to allow the gate voltage to vary along (float) with the RF signal at the drain of the corresponding device, which consequently allows control of the voltage drop across the corresponding device, thus controlling the conduction of the device in accordance to the voltage at its drain, for a more efficient operation of the device. In the case where this floating technique is applied to several stacked devices, voltage across the devices can be equalized by choosing the correct combination of gate capacitor and gate bias voltage for each of the devices. The skilled person will appreciate the difference of such a gate capacitor, as it is not used as a traditional bypass capacitor. Teachings about this floating technique, also referred to as conduction controlling circuit, can be found in U.S. Pat. No. 7,248,120, which is incorporated herein by reference in its entirety.

With reference to FIG. 10E, when the switch (1012) grounds the gate of device (1017), this device cannot operate in the floating mode via gate capacitor (1028) and as such will see a larger voltage (e.g. twice as large) applied across its drain and source terminals as the voltage equalization chain is broken. In order to protect this device (1017) from excessive voltage, in one embodiment the bias voltage applied to the other devices in the stack (above (1017)) may be modified to re-equalize the voltage across these devices which consequently lowers the voltage across (1017). A switch (e.g. (1080a)) may be associated to each device used in the voltage equalization chain to select from one of two DC bias voltages (DC bias1, DC bias2), one for the case when device (1017) is part of the equalization chain and one for the case when the device (1017) is not part of the equalization chain. The same enable signal (1005) used to activate/deactivate the unit cell may be used to control the switch (1080a).

Switching the input device will change the impedance looking into the amplifier core. Use of a tunable input matching circuit can compensate for these changes. The use of techniques that switch one of the cascode devices (a device higher in the stack) will have a much smaller effect on the amplifier's input impedance. This is because the gate bias on the bottom or common source stage will be maintained and thus the change in capacitance will be reduced.

FIG. 10D shows an embodiment of a unit cell of the SP amplifier (910) of FIGS. 9A-9B that allows variable bias current in the unit cell. A person skilled in the art may recognize the arrangement shown in FIG. 10D as a current mirror. A reference current (1043) flowing through transistors (1035, 1037) will be approximately copied as a bias current in the transistors (1015, 1017) that serve to amplify an RF input signal applied to the input node (1008). A bias voltage, not shown, is applied to the gates of the cascode transistors (1037) (1017). Consequently, changing the reference current (1043) will result in changing the bias current flowing through the transistors (1015, 1017) and consequently control the ON or OFF state of the unit cell as well. Switches similar to switches (1070, 1080) employed in FIGS. 10B and 10C can also be utilized in the unit cell of FIG. 10D to control ON or OFF state of the unit cell. A person skilled in the art will appreciate that various combinations of the embodiments shown in FIGS. 10A-10D are also possible and are within the scope of the present disclosure.

The switches (1070, 1080) shown in FIGS. 10B and 10C used for turning ON or OFF the unit cell can be operated by enable signals (1005). Such enable signals (1005) may be generated by control circuitry within an SP or SPTM amplifier itself, a transmitter that drives the SP or SPTM amplifier, outside control circuitry (e.g. a controller of a cellular phone), or some other source. The switches (1070, 1080) can be constructed as transmission gates, by using FETs, by using BJTs, or by any other means for implementing a switch that are known to or that can be envisioned by a person skilled in the art (e.g. U.S. Pat. No. 7,910,993 previously mentioned).

Furthermore, as previously mentioned, given an input power (e.g. usually measured in milliwatts) provided to an SP or SPTM amplifier and a desired power gain (e.g. usually measured in dB), an expected output power of the SP or SPTM amplifier can be calculated according to techniques known to a person skilled in the art. Because the output power is proportional to an area of the cross-hatched regions as illustrated in previous figures (e.g. FIG. 3), the expected output power can be used to determine a necessary DC bias current. Based on the necessary DC bias current, a minimum number of unit cells capable of delivering the necessary DC bias current can be determined and in turn the number of unit cells to be turned ON can be determined based on this minimum. A control word comprising one or more control signals (1005) can be generated to control ON or OFF states of the unit cells based on the above calculations/determinations.

According to the method of reducing bias current in combination with increasing load impedance seen by the entire power amplifier (previously described with reference to current and voltage graphs shown in FIGS. 8A and 8B), inactive unit cells can be activated to increase total output current of the SP amplifier (910) or active unit cells can be deactivated to decrease total output current of the SP amplifier (910), as needed, to adjust for differing input signal power levels. Control circuitry comprised of a controller (not shown) and signal lines connecting the controller to individual unit cells can selectively activate or deactivate the individual unit cells. By way of example and not of limitation, the controller may be a portion of a control unit of a cellular phone or wireless device. A person skilled in the art will realize that an amplifier can be constructed using a scalable periphery architecture alone, without tunable matching. Also scalable periphery architecture alone can achieve significant benefits, as already mentioned above.

With reference back to FIGS. 7A and 7B, a scalable periphery architecture alone can be controlled to reduce DC bias current and thereby reduce DC power dissipation. As previously mentioned, reduced DC power dissipation with reduced RF signal input drive can result in higher drain efficiency than a fixed amplifier whose DC power dissipation is constant (see FIGS. 3 and 4). With reference to FIGS. 3 and 4, for a fixed amplifier, when the RF drive decreases, the RF output power decreases even as DC power dissipation remains fixed. Fixed DC power dissipation in the graphs of FIGS. 3 and 4 is indicated by a fixed size of the solid box. Reduced RF output power is indicated by a reduced size of the cross-hatched box in FIG. 4 as compared to FIG. 3. A combination of reduced RF output power with fixed DC power dissipation can result in lower drain efficiency as RF drive decreases. In contrast, in the graphs of FIG. 7A, although RF output power is reduced with reduced RF drive, DC power dissipation is also decreased. Reduced drain efficiency for the case of reduced RF drive can be a salient issue in applications such as voice communications, where the amplifier may be operating at maximum power for a small percentage of total time.

With reference back to FIG. 9A, the SPTM power amplifier architecture (950) also comprises a tunable matching network (920) connected to the output of the SP amplifier (910). Such a tunable matching network (920) can be configured to dynamically adjust the output impedance seen by the SP amplifier (910), increasing the output impedance (adjusting the load line for a shallower slope) when unit cells are deactivated or decreasing the output impedance (adjusting the load line for a steeper slope) when more unit cells are activated. Through load line adjustment by way of the tunable matching network (920), the individual unit cells that remain active can see a constant output impedance.

A person skilled in the art will be aware that a fixed (e.g. non-tunable) impedance matching network can be constructed using discrete capacitors and inductors when a wavelength corresponding to a frequency of operation is large compared to the size of such capacitors and inductors and parasitic effects of such capacitors and inductors are not significant at the frequency of operation, or by using distributed elements (e.g. open circuit or short circuit stubs placed in series or in parallel between the load and output terminals of the power amplifier) when the wavelength corresponding to the frequency of operation is small compared to the size of the circuit elements. Design procedures and equations for fixed impedance matching networks can be readily found in textbooks addressing the subjects of RF engineering and microwave engineering and are assumed to be known to a person skilled in the art.

Figure 11:
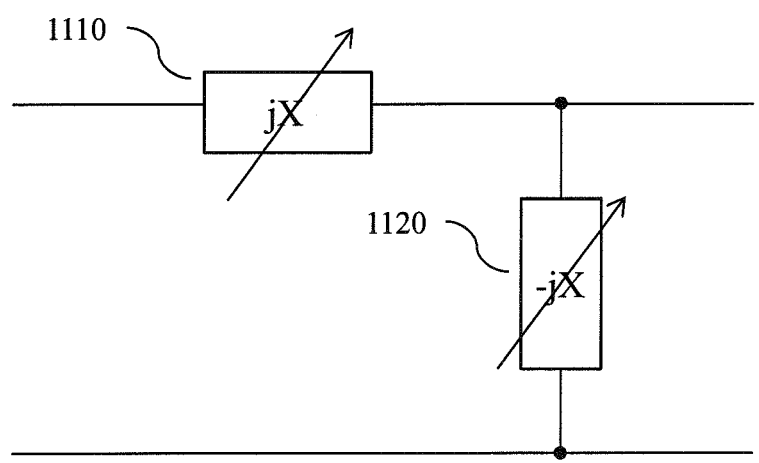
FIG. 11 shows an exemplary tunable matching network that can be utilized in the SPTM power amplifier architecture of FIG. 9A-9C.
Figure 19:
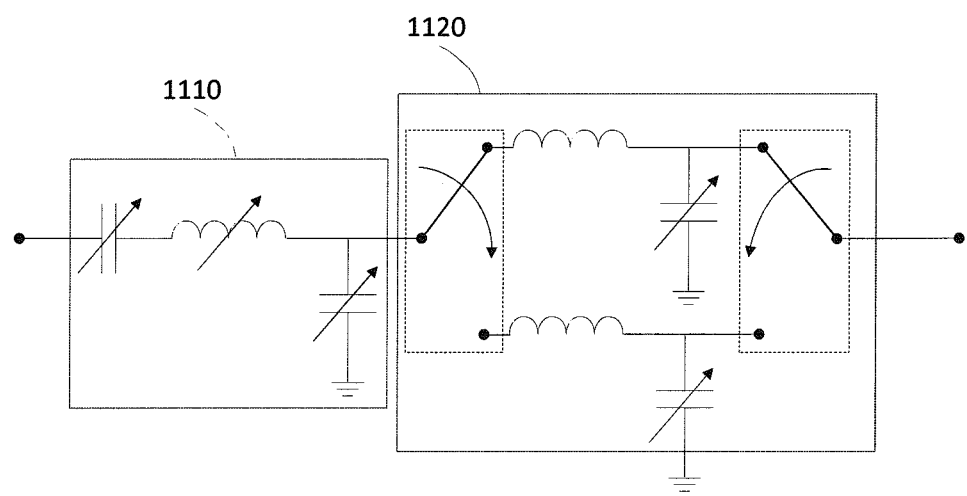
FIG. 19 shows an exemplary realization of the tunable matching network of FIG. 11, wherein switches and tunable reactive elements are used.

FIG. 11 shows an exemplary tunable matching network that can be utilized in the SPTM power amplifier architecture (950) of FIG. 9A. The tunable matching network can comprise a tunable reactive element (1110) placed in series between two impedances to be matched and a tunable reactive element (1120) placed in parallel relative to two impedances to be matched. Details regarding tunable reactive elements, including tunable capacitors and inductors, are described, for example, in PCT publication number WO2009/108391 entitled "Method and Apparatus for use in Digitally Tuning a Capacitor in an Integrated Circuit Device", published on Sep. 3, 2009, and in U.S. patent application Ser. No. 13/595,893 entitled "Method and Apparatus for Use in Tuning Reactance in an Integrated Circuit Device", filed on Aug. 27, 2012, both incorporated by reference herein in their entirety, where examples of digital tuning capacitors and/or digital tuning inductors for use in a tunable matching network are disclosed. A person skilled in the art will be aware that matching networks such as shown in FIG. 11 can be joined together in a π-configuration, a t-configuration, or a cascade configuration as needed to achieve necessary bandwidth characteristics and quality factor (Q factor) and can be configured to transform impedances upward or downward. FIG. 19 shows an exemplary realization of the tunable matching network of FIG. 11, wherein a combination of switches and variable capacitors and inductors are used.

A person skilled in the art will also be aware that such an SPTM architecture (e.g. as shown in FIGS. 9A-9C) may be constructed on a single chip where both the SP and TM components are integrated monolithically, or alternatively the TM component may be partially integrated (or not at all). Various configurations and corresponding partitioning within a single or multiple chips may depend on the used components and related technologies.

According to several embodiments of the present disclosure, with reference to FIG. 9A, operation of the SP amplifier (910) and the TM network (920) is generally dependent on each other. In general, impedance presented by the TM network (920) depends on the number of unit cells turned ON or OFF in the SP amplifier (910). Consequently, control signals generated by control circuitry associated with the SP amplifier (910) and those generated by control circuitry associated with the TM network (920) can be dependent on one another. Control circuitry of the TM network (920) can be configured to adjust individual tunable reactive elements as needed to result in a desired value of impedance presented by the TM network (920) to the output of the SP amplifier (910). In some embodiments, the control circuitry for both the SP amplifier (910) and the TM network (920), as well as the SP amplifier itself can be integrated in one control circuit using for example silicon technologies, which include, but are not limited to, complementary metal oxide semiconductor (CMOS) technology, silicon on insulator (SOI) CMOS technology, silicon on sapphire (SOS) CMOS technology, and bipolar CMOS (BiCMOS) technology (e.g. technology involving a combination of bipolar junction transistors and CMOS transistors).

In addition to adjusting for differing signal input power levels, the SPTM architecture allows tuning of the amplifier for differing frequencies of operation and/or differing wireless standards (e.g. LTE, WiMAX, or 4G, among others) and modes (modulation and thus bandwidth, PAR, . . . ) over the range of output powers, and thus reduce the trade-off between linearity and efficiency previously discussed. Such adjustment would comprise returning (e.g. via control) the amplifier to achieve the desired impedance match and output power level at a given frequency of operation and/or for a given wireless standard/mode. This flexibility of tuning for specific parameters allows customization of the SPTM amplifier to customer requirements.

In one embodiment, SPTM can be put in a feed forward control system that monitors the power levels, PAR, frequency and other related operational parameters of the SPTM. In another embodiment SPTM can be used in an open loop manner. In open loop, SPTM settings as a function of power and frequency would be calibrated and stored. A lookup table could then convert frequencies and powers into SPTM settings. Same principle of using lookup tables may also be applied to a closed loop configuration, whereby the system monitors the related operational parameters and uses the content of the lookup tables to automatically provide corrections and/or changes to the SPTM operation. The calibration table and lookup/conversion function can reside in the PA itself, or in the baseband/transceiver IC (hardware and/or software). It is envisioned that one could store calibration information in the PA using fuses, EEPROM, laser trim, or directly writing to the registers from a baseband IC. If the calibration information is stored in the PA itself, it can be pre-configured in IC production so that all PAs reaching the handset manufacturer look the same.

A person skilled in the art will realize that the scalable periphery amplifier or scalable periphery tunable matching amplifier of the disclosure can be used as an intermediate stage as well as a driver stage in an RF device. Furthermore, efficiency can be optimized by combining multiple amplifiers in a signal chain and selectively routing the signal through certain amplifiers depending on desired output power, such as described, for example, in U.S. Pat. No. 7,795,968, issued on Sep. 14, 2010 and entitled "Power Ranging Transmit RF Power Amplifier, which is incorporated herein by reference in its entirety. In such a configuration, any or all of the multiple amplifiers may be designed using the scalable periphery amplifier or scalable periphery tunable matching amplifier of the present disclosure.

Figure 12:
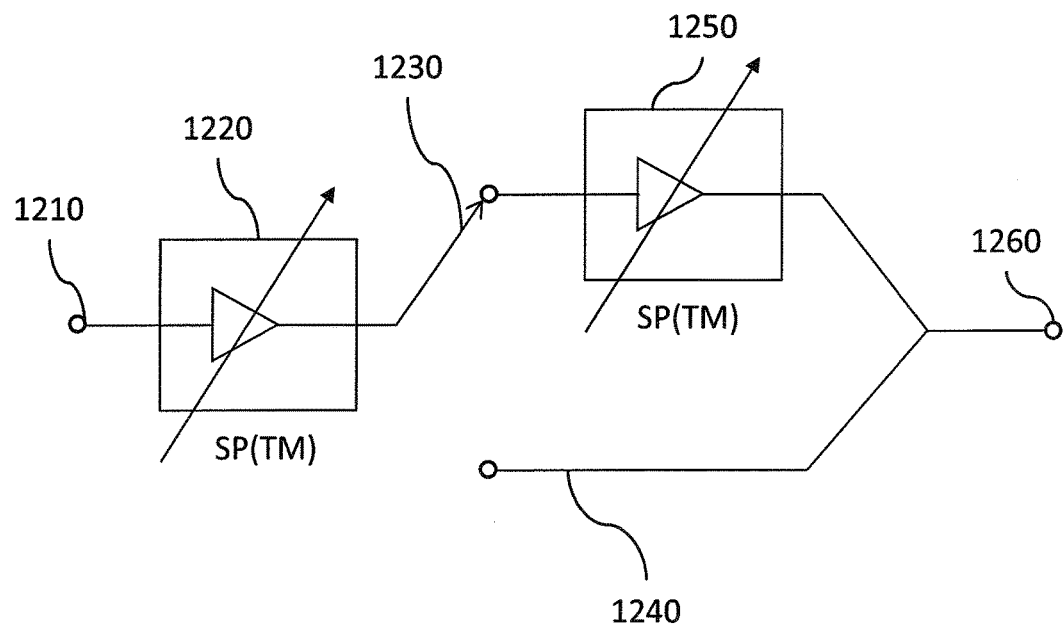
FIG. 12 shows an exemplary embodiment of the disclosure comprising multiple SPTM amplifiers.

FIG. 12 shows an exemplary embodiment of the disclosure comprising multiple SP(TM) amplifiers. The two amplifiers (1220) and (1250) can both be SP (scalable periphery) amplifiers or SPTM (scalable periphery tunable matching) amplifiers or some combination thereof. Although the configuration shown in FIG. 12 only shows two amplifiers, a person skilled in the art will realize that more amplifiers can also be connected in cascade or in parallel. An input signal applied to input terminal (1210) can be amplified by SP(TM) amplifier (1220). A switch (1230) can then route the signal to a through circuit (1240) that is configured to pass the signal unaltered directly to an output terminal (1260) for lower output power or to a second SP(TM) amplifier (1250) for higher output power. Consider an exemplary case where the amplifier (1220) comprises both a scalable periphery amplifier (910) and a tunable matching network (920) (e.g. as shown in FIG. 9A). Because the switch (1230) can be operated to direct the signal directly to the output (1260) or to the second SPTM amplifier (1250), the tunable matching network (920) of the SPTM amplifier (1220) can be useful because impedance at the output (1260) may be different than an input impedance of the second SP(TM) amplifier (1250), requiring impedance presented to an output of the SP(TM) amplifier (1220) to be different depending on connection established by the switch (1230). In some embodiments the switch (1230) may be omitted to provide direct coupling between the two amplifiers (1220) and (1250). In some embodiments the amplifier (1220) may be a driver stage, and the amplifier (1250) a final stage.

Figure 15:
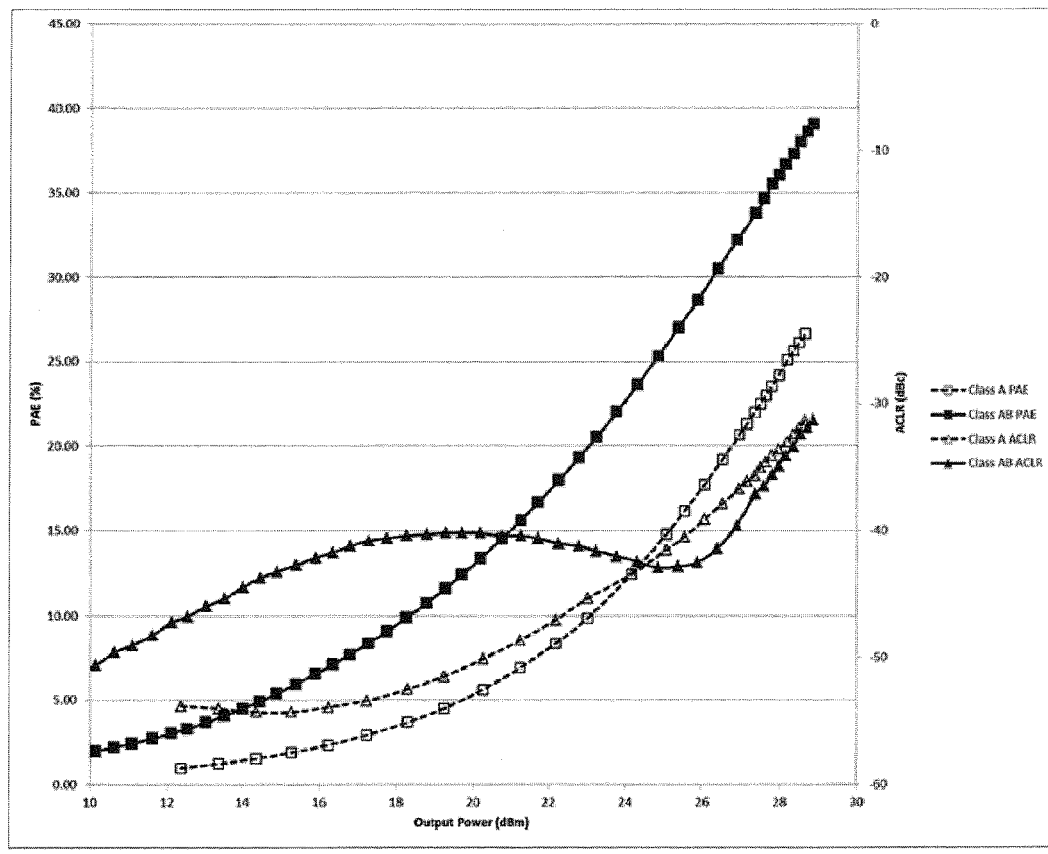
FIG. 15 shows PAE (power added efficiency) and ACLR as a function of output power for both class A and class AB operation.
Figure 16:
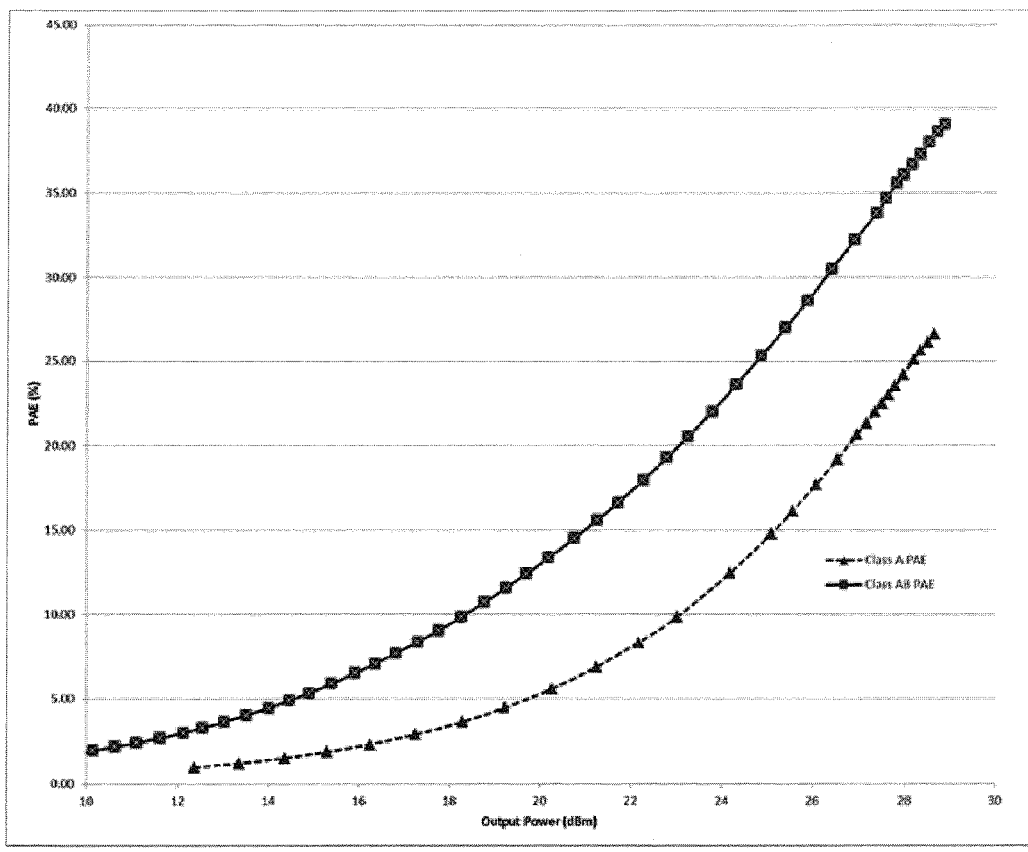
FIG. 16 shows PAE as a function of output power for both class A and class AB operation.
Figure 17:
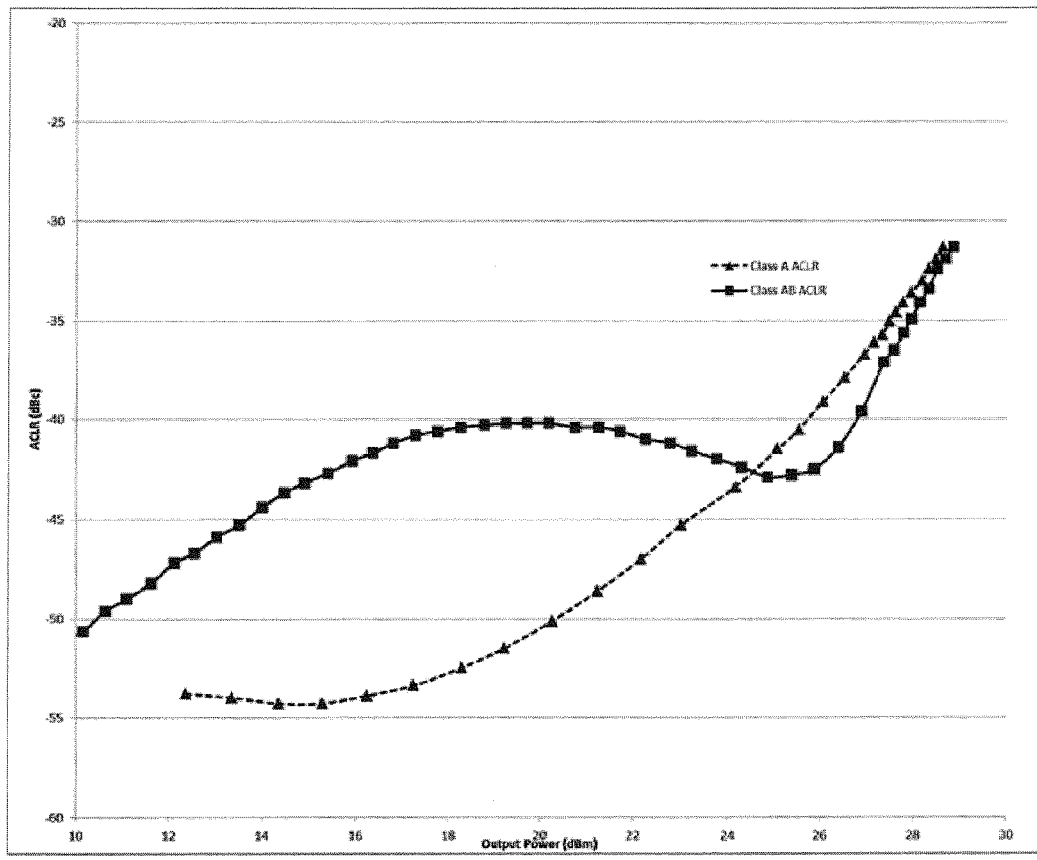
FIG. 17 shows ACLR as a function of output power for both class A and class AB operation.

As discussed previously, DC bias current to individual unit cells can be varied to achieve certain desired ACLR vs. output power characteristics. FIG. 17 shows ACLR as a function of output power for both class A and class AB operation, corresponding to the SPTM amplifier with a total of N number of unit cells. With reference to the curve corresponding to class AB operation with all unit cells operating, output power can be adjusted by adjusting input power. FIG. 16 shows PAE as a function of output power for both class A and class AB, corresponding to the same device shown in FIG. 17, and FIG. 15 is a combined representation of FIGS. 16 and 17.

Figure 14:
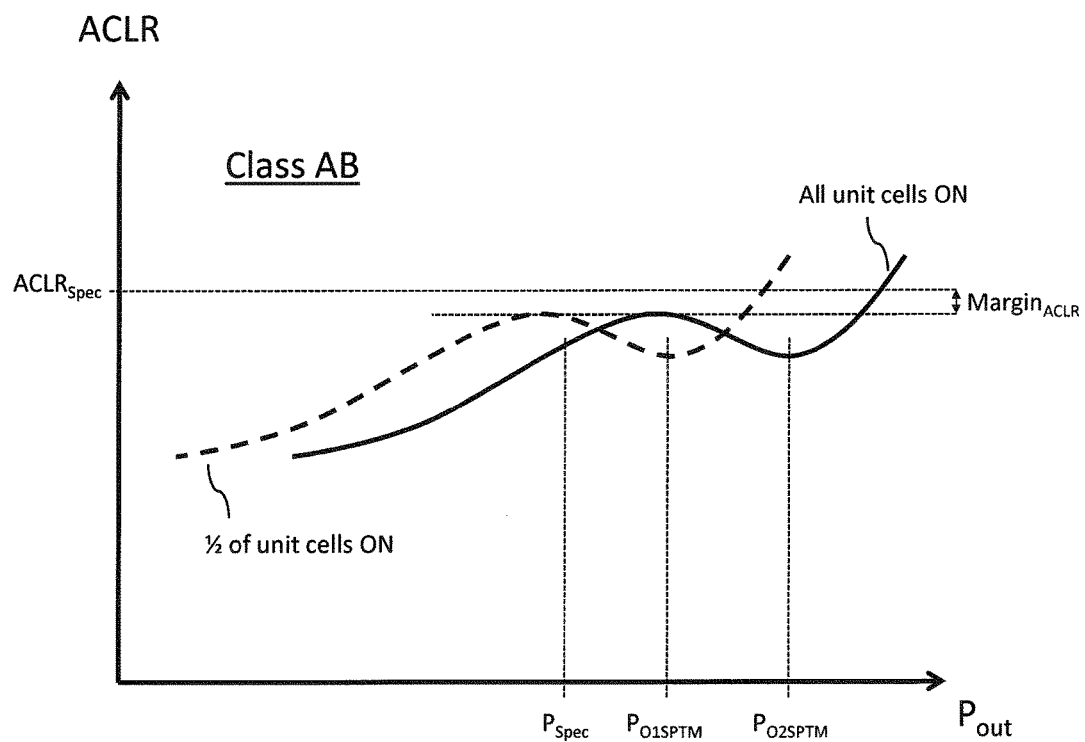

A given design specification may require operation at or above a certain power level (e.g. $P_{spec}$) and below a certain ACLR (e.g. $ACLR_{spec}$) as shown in FIG. 14. Performance variation can result from, for example, changes in frequency, battery voltage, power level, and other characteristics. Normally, in order to ensure proper operation despite such variations, an amplifier is designed to provide margins for both ACLR (e.g. $Margin_{ACLR}$) and output power (e.g. $Margin_{Power}$). As output power (e.g. $P_{out}$) changes in a conventional amplifier or an SPTM amplifier with all unit cells constantly active, an operating point moves along the curve. In some embodiments, the entire curve can be shifted to the left (e.g. by turning OFF unit cells) or to the right (e.g. by turning ON unit cells) rather than shifting an operating point along the curve. Shifting the entire curve left or right rather than shifting an operating point along the curve allows a designer to reduce the margins (e.g. $Margin_{ACLR}$ and $Margin_{Power}$) necessary to ensure that amplifier operation remains within desired specifications. Although ACLR is used here as a reference to a desired operation of the amplifier for a given output power, the skilled person will realize that other references, such as linearity, drain current, out of band emissions, Rx band noise, EVM and the like may also be used individually or in combination with one another.

For example, in reference to FIG. 14, a point labeled $P_{O1SPTM}$ corresponds to an output power level with half of the total number of unit cells operating, and a point labeled $P_{O2SPTM}$ corresponds to an output power level with all of the unit cells operating. Both points $P_{O1SPTM}$ and $P_{O2SPTM}$ correspond to operation in a class AB null (represented by a dip in the ACLR versus Pout curve). In some embodiments of the present disclosure, adjustment of final size shifting the entire curve left or right and/or switching the PA between different classes of operation (e.g. switching between class A and class AB) enables reduction of the margins needed to guarantee desired performance over a range of frequencies, battery voltages, power levels, and other characteristics. Such adjustment may be obtained in a closed loop or open loop control configuration, which may include lookup tables and/or calibration tables containing mapping between amplifier's operating characteristic and the various affecting parameters.

In a further embodiment, the SPTM amplifier shown in FIG. 9A can be adjusted during circuit operation to operate either as a class A amplifier or a class AB amplifier. The scalable periphery amplifier (910) and/or the tunable matching network (920) can be adjusted to change the SPTM amplifier from class A operation to class AB operation or vice versa. In a further embodiment, individual unit cells of the scalable periphery amplifier (910) can be individually adjusted to operate either as a class A amplifier or a class AB amplifier. For example, one half of active unit cells may be adjusted to operate as class A amplifiers while a remaining half of active unit cells may be adjusted to operate as class AB amplifiers.

The curves of FIG. 17 correspond to an exemplary case of 10 MHz LTE baseband signal, 782 MHz carrier frequency, QPSK modulation and coding, 115 mA of DC bias current, and a supply voltage of 3.5 V. In the curves of FIG. 17, output power was adjusted by appropriate adjustment of input power.

Although class A operation can result in lower ACLR at output powers below approximately 26 dBm, at higher output powers class AB operation results in lower ACLR. Thus, at output power levels below approximately 26 dBm, class A operation can be selected, while at output power levels above approximately 26 dBm, class AB operation can be selected. Class A and class AB operation exhibit different ACLR versus output power characteristics because of different linearities and different conduction angles (a class A amplifier conducts current throughout an entire cycle of oscillation of the amplifier, while a class AB amplifier conducts current through between 50% and 100% of the entire cycle of oscillation of the amplifier). The conduction angle generally refers to an angle measure corresponding to a percentage of a cycle of oscillation during which the amplifier is conducting. A class A amplifier, for example, may be stated to have a conduction angle of a radians or 360 degrees because it conducts throughout the entire cycle of oscillation.

Appropriate adjustment of the SPTM amplifier can maintain operation in a class AB null. Switching between class A operation and class AB operation can be useful in keeping ACLR below a desired limit (e.g. −35 dBc).

Different systems and different standards may have different ACLR requirements that must be met. For example, many LTE systems may allow a maximum ACLR of −33 dBc. In general, ACLR requirements are determined by a physical distance between the amplifier and a receiver operating on an adjacent channel that may receive interference from the amplifier. For example, geographic layout of a cellular network as well as frequency allocation can play a role in determining such distance. Many commercially available amplifiers exhibit maximum ACLR of −35 to −37 dBc.

The SPTM amplifier (910) (see, e.g., FIG. 10A) can be switched between class A and class AB operation by adjusting a bias of one or more of the transistors in a unit cell.

Furthermore, optimum PAE (power added efficiency) for a class AB linear PA occurs in the class AB null (represented by a dip in the ACLR versus Pout curve, e.g. FIG. 17). By optimally choosing the SPTM switch points (primarily the SP switch points, e.g. adjusting the number of unit cells that are ON) as a function of output power, the PA can be kept in the class AB null. As used herein, the term "SPTM switch points" may refer to points at which final size of the scalable periphery amplifier (910) and/or the tunable matching network (920) (see, e.g., FIG. 9A) is changed. For example, a first SPTM switch point may correspond to a first power level (e.g. 15 dBm), where dropping below the first power level may correspond to changing a number of active unit cells from a first number (e.g. 11 unit cells) to a second number (e.g. 10 unit cells) and increasing above the first power level may correspond to changing the number of active unit cells from the second number to the first number.

Choosing of optimal SPTM switch points generally involves accurate knowledge of the target output power, as trying to get too much power out of a certain final size can result in ACLR that is above a given specification. For an exemplary case of cell phone communications, some factors that are used to determine target output power include distance from a cell phone to a nearest base station (e.g. greater distance may indicate higher target output power) as well as whether the cell phone is transmitting data or voice (e.g. data transmission generally requires higher power than voice transmission). Based on such factors, the nearest base station may signal the cell phone indicating the target output power that the cell phone should use when transmitting.

Figure 13:
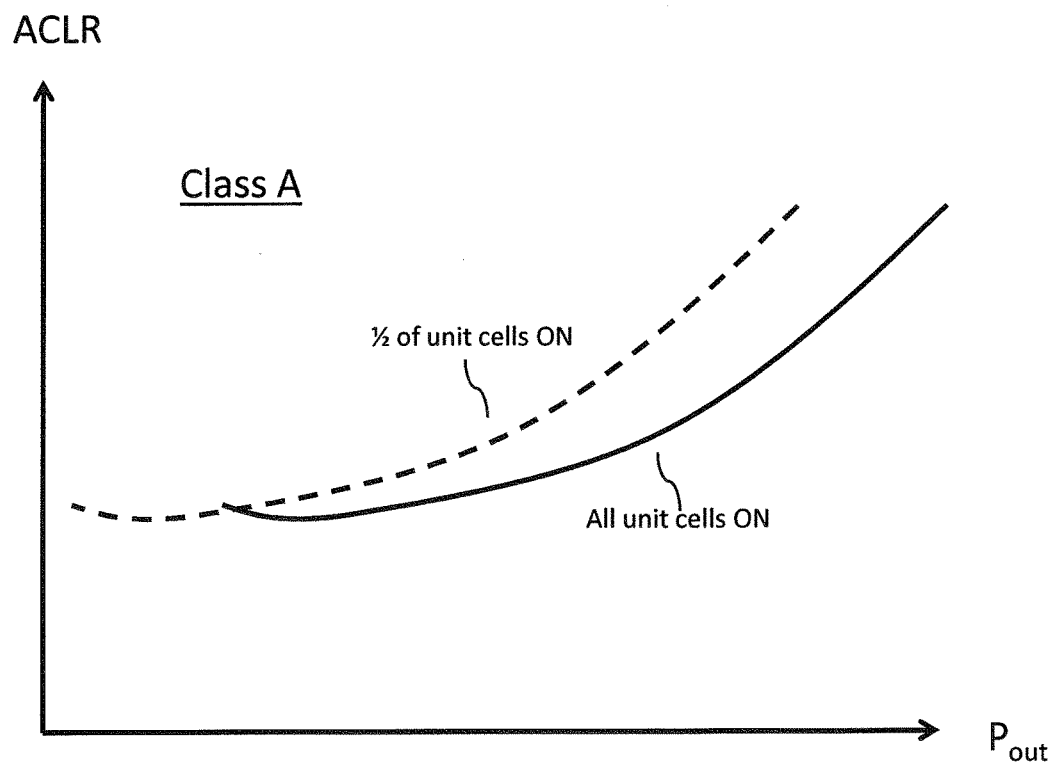

As discussed previously, turning OFF unit cells can shift the entire curve of FIG. 17 to the left, while turning ON unit cells can shift the entire curve to the right. As a result, operation of the SPTM amplifier can be maintained in the AB null at different power levels. Control of the SPTM amplifier can be implemented as either open loop (e.g. no feedback) or closed loop (including feedback) control. It may also be helpful to adjust bias voltage in addition to selectively activating or deactivating unit cells. FIGS. 13 and 14 show shifting of the ACLR versus output power curves when half of the unit cells are turned off for class A and class AB operations respectively.

Alternatively, use of switching to include or omit harmonic terminations (e.g. the harmonic shorts or opens) in conjunction with high RF input can adjust an individual unit cell to operate as a switching amplifier (e.g. class D, E, F). For example, in order to operate as a class E amplifier, a capacitor can be connected to the drain. In order to operate as a class F amplifier, even harmonics can be shorted and odd harmonics can be opened. Furthermore, in some embodiments harmonic termination can be used to further "tweak" a response of the amplifier to obtain a desired operating characteristic (e.g. linearity, ACLR, output power, drain current, out of band emissions, Rx band noise, EVM, and so forth) within a given class of operation.

Figure 18:
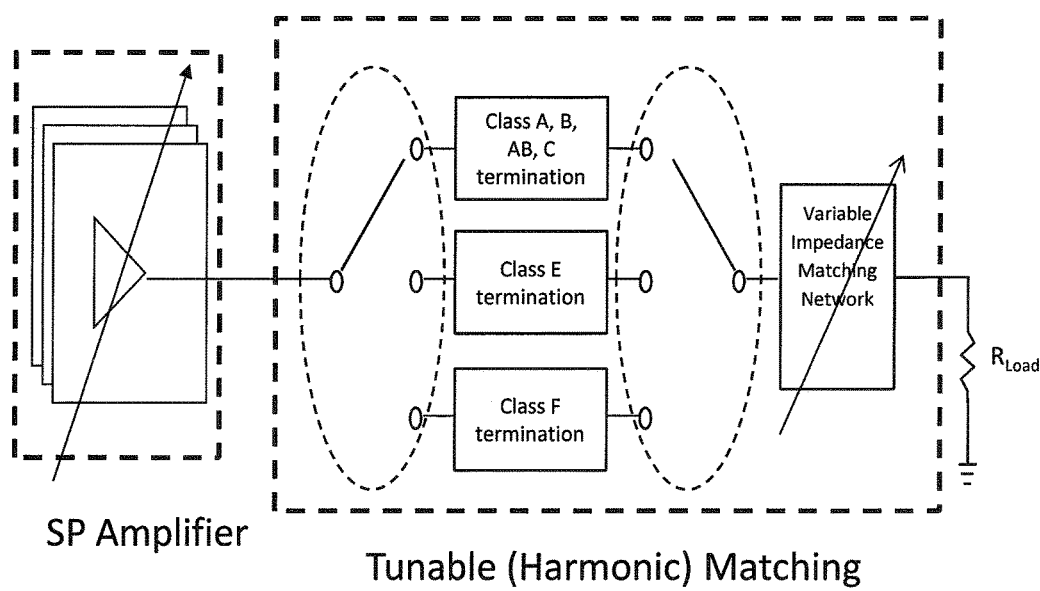
FIG. 18 shows an example implementation of switching between various classes of amplifiers.
Figure 20:
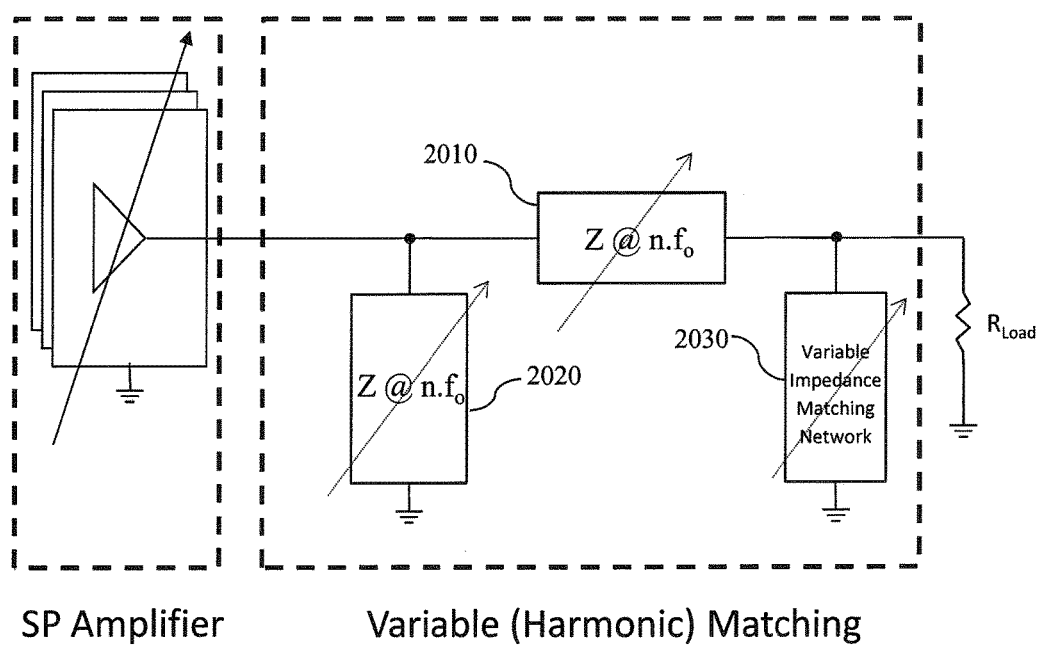
FIG. 20 shows an example implementation of using variable impedance circuits to affect a harmonic termination for a desired class of operation.

By way of example and not of limitation, FIG. 18 shows an exemplary method of switching between the different classes (e.g., class A, AB, B, C, E, F) of amplifier operation. The scalable periphery amplifier is connected with an output tunable matching circuit, and the tunable matching circuit can comprise a switch that selects the desired class of operation (e.g. harmonic termination). The variable impedance matching network can change the impedance to match the impedance of the scalable periphery amplifiers with the load, depending on the class of amplifier operation that is selected. In some embodiments usage of switches to select a harmonic termination for a desired class of operation and as depicted by FIG. 18 may be avoided. FIG. 20 shows such an embodiment, wherein instead of selecting fixed impedances using a switch, variable impedance circuits (2010, 2020) are used to provide the desired harmonic termination ($f_0$ denoting a fundamental frequency, typically the center operating frequency of the amplifier, and $n \cdot f_0$ the corresponding harmonics) to the output of the SP amplifier. This configuration of FIG. 20 has the added advantage to remove any energy dissipation due to the switches of FIG. 18 which are used to switch a path to the RF output signal from the amplifier. It is to be noted that switches may be used within the variable impedance circuits (2010, 2020) of FIG. 20.

The examples set forth above are provided to give those of ordinary skill in the art a complete disclosure and description of how to make and use the embodiments of the scalable periphery tunable matching power amplifier of the disclosure, and are not intended to limit the scope of what the inventors regard as their disclosure.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications can be made without departing from the spirit and scope of the present disclosure. Accordingly, other embodiments are within the scope of the following claims.

The invention claimed is:

1. An amplifier, comprising:
   one or more unit cells connected in parallel with each other and adapted to be selectively activated or deactivated, wherein each unit cell comprises:
   a) a stack of a plurality of transistors configured to operate as an amplifier; and
   b) one or more gate capacitors connected to respective one or more transistors of the plurality of the transistors;
   an amplifier control circuitry configured to selectively activate or deactivate the one or more unit cells;
   wherein:
   an input transistor of the plurality of transistors in the stack is configured to receive an input signal;
   the one or more gate capacitors are connected between one or more gates of the respective one or more transistors of the plurality of transistors in the stack and a reference ground with the exception of the input transistor, and
   a non-bypassing gate capacitor of the one or more gate capacitors is configured to allow a gate voltage of a respective transistor of the plurality of transistors to vary along with a radio frequency (RF) voltage at a drain of the respective transistor.

2. The amplifier of claim 1, wherein each of the one or more unit cells comprises a switch connected in series with the gate of the input transistor of the stack, the switch being configured to open or close the input signal path to the input transistor, thus selectively activating or deactivating a corresponding unit cell.

3. The amplifier of claim 1, wherein a bias applied to a transistor of a stack other than the input transistor is configured to be adjusted in correspondence of activating or deactivating a corresponding unit cell.

4. The amplifier of claim 2, wherein the switch is configured to selectively connect the gate of the input transistor to either the input signal or to a fixed voltage, so as to selectively activate or deactivate the one or more unit cells.

5. The amplifier of claim 1, wherein each of the one or more unit cells comprises a switch connected in series with a gate of any transistor other than an input transistor of the stack, the switch being configured to turn ON and OFF the transistor thus selectively activating or deactivating the one or more unit cells.

6. The amplifier of claim 1, wherein each of the one or more unit cells comprises a switch connected in series with a gate of any transistor other than an input transistor of the stack, the switch being configured to selectively connect the transistor to either a first bias voltage or a second bias voltage.

7. The amplifier of claim 6, wherein each switch is controlled by the amplifier control circuitry.

8. The amplifier of claim 1, wherein each unit cell of the one or more unit cells is a biased unit cell, a bias being applied to said biased unit cell.

9. The amplifier of claim 2, wherein each unit cell of the one or more unit cells is a biased unit cell, a bias being applied to said biased unit cell.

10. The amplifier of claim 1, further comprising an output tunable matching network operatively connected to an output of the amplifier, wherein the tunable matching network is configured to adjust an output load impedance seen by the output of the amplifier.

11. The amplifier of claim 2, further comprising an output tunable matching network operatively connected to an output of the amplifier, wherein the tunable matching network is configured to adjust an output load impedance seen by the output of the amplifier.

12. The amplifier of claim 10, further comprising an input tunable matching network operatively connected to an input of the amplifier, wherein an impedance of the input tunable matching network is configured to adjust relative to an input impedance of the input of the amplifier.

13. The amplifier of claim 1, further comprising a current mirror operatively connected to the gates of the plurality of transistors of the stack, wherein the current mirror is adapted to provide biasing to the plurality of transistors.

14. The amplifier of claim 13, wherein the current mirror is configured to selectively activate or deactivate a unit cell in correspondence of the plurality of transistors.

15. The amplifier of claim 1, wherein the input transistor of the plurality of transistors in the stack of each of the one or more unit cells is further configured to receive a bias voltage, the bias voltage being selectively switchable between a first DC voltage and a second DC voltage and wherein during operation, the input signal is received by the input transistor in the stack of each of the one or more unit cells.

16. The amplifier of claim 15, wherein the second DC voltage is ground.

17. The amplifier of claim 11, further comprising an input tunable matching network operatively connected to an input of the amplifier, wherein an impedance of the input tunable matching network is configured to adjust relative to an input impedance of the input of the amplifier.

* * * * *